(12) United States Patent
Lee et al.

(10) Patent No.: US 10,741,564 B2
(45) Date of Patent: Aug. 11, 2020

(54) SRAM DEVICE PROVIDED WITH A PLURALITY OF SHEETS SERVING AS A CHANNEL REGION

(71) Applicant: Samsung Electronics Co., Ltd., Suwon-si, Gyeonggi-do (KR)

(72) Inventors: Donghun Lee, Anyang-si (KR); TaeYong Kwon, Suwon-si (KR); Dongwon Kim, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/255,652

(22) Filed: Sep. 2, 2016

(65) Prior Publication Data
US 2017/0194330 A1 Jul. 6, 2017

(30) Foreign Application Priority Data
Jan. 4, 2016 (KR) .................. 10-2016-0000491

(51) Int. Cl.
| | | |
|---|---|---|
| *H01L 27/11* | (2006.01) | |
| *H01L 27/11582* | (2017.01) | |
| *H01L 27/092* | (2006.01) | |
| *H01L 29/417* | (2006.01) | |

(52) U.S. Cl.
CPC ........ *H01L 27/1104* (2013.01); *H01L 27/092* (2013.01); *H01L 27/11582* (2013.01); *H01L 29/41775* (2013.01)

(58) Field of Classification Search
CPC .............................. H01L 27/11; H01L 27/092

USPC .................... 257/369, 368; 438/184, 527
See application file for complete search history.

(56) References Cited

U.S. PATENT DOCUMENTS

| | | | |
|---|---|---|---|
| 7,427,788 B2 | 9/2008 | Li et al. | |
| 8,158,472 B2 | 4/2012 | Miyashita | |
| 8,169,025 B2 | 5/2012 | Bedell et al. | |
| 8,216,902 B2 | 7/2012 | Chang et al. | |
| 8,395,220 B2 | 3/2013 | Chang et al. | |
| 8,513,067 B2 | 8/2013 | Huang et al. | |
| 9,000,530 B2 | 4/2015 | Balakrishnan et al. | |
| 9,034,704 B2 | 5/2015 | Balakrishnan et al. | |
| 9,048,317 B2 | 6/2015 | Wann et al. | |
| 9,257,545 B2 | 2/2016 | Leobandung | |
| 9,305,801 B2 | 4/2016 | Sung et al. | |
| 9,306,070 B2 | 4/2016 | Baek et al. | |
| 2006/0038234 A1* | 2/2006 | Liaw .................. G11C 8/16 | |
| | | | 257/368 |
| 2006/0240622 A1* | 10/2006 | Lee .................. H01L 29/42392 | |
| | | | 438/257 |
| 2007/0287239 A1* | 12/2007 | Yoon .................. H01L 27/11 | |
| | | | 438/184 |

(Continued)

FOREIGN PATENT DOCUMENTS

TW 201349359 A 12/2013

*Primary Examiner* — Sheng-Bai Zhu
(74) *Attorney, Agent, or Firm* — Sughrue Mion, PLLC

(57) ABSTRACT

An SRAM device includes first, second and third transistors, which are used as a pass gate transistor, a pull-down transistor, and a pull-up transistor, respectively. A channel region of each transistor may include a plurality of semiconductor sheets that are vertically stacked on a substrate. The semiconductor sheets used as the channel regions of the first and second transistors may have a width greater than the semiconductor sheets used as channel regions of the third transistor.

17 Claims, 36 Drawing Sheets

(56) References Cited

U.S. PATENT DOCUMENTS

| | | | |
|---|---|---|---|
| 2008/0001213 A1* | 1/2008 | Zhu | H01L 21/823814 257/327 |
| 2012/0168872 A1* | 7/2012 | Chang | B82Y 10/00 257/368 |
| 2014/0001441 A1* | 1/2014 | Kim | H01L 29/0673 257/29 |
| 2014/0001520 A1 | 1/2014 | Glass et al. | |
| 2014/0091360 A1* | 4/2014 | Pillarisetty | H01L 29/7853 257/190 |
| 2014/0312427 A1 | 10/2014 | Maeda et al. | |
| 2015/0090958 A1* | 4/2015 | Yang | H01L 29/0676 257/27 |
| 2016/0027870 A1* | 1/2016 | Cheng | H01L 29/42356 257/347 |

* cited by examiner

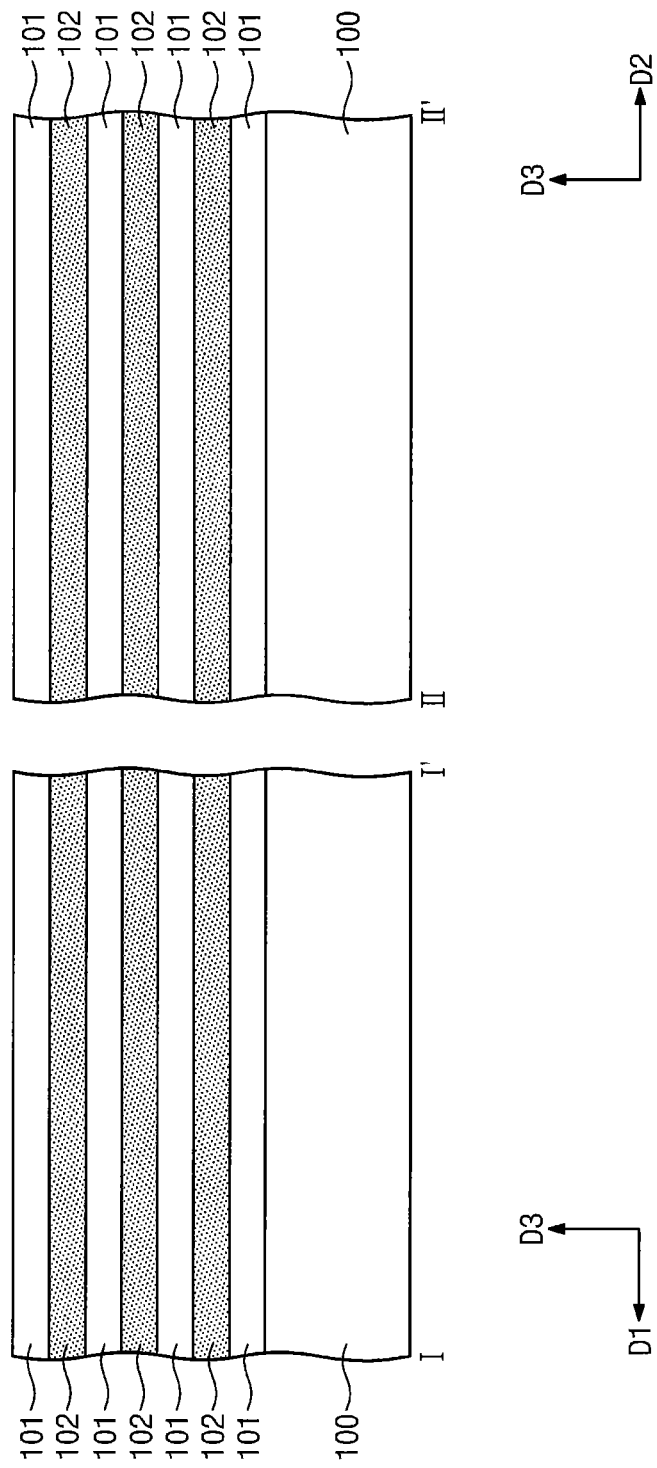

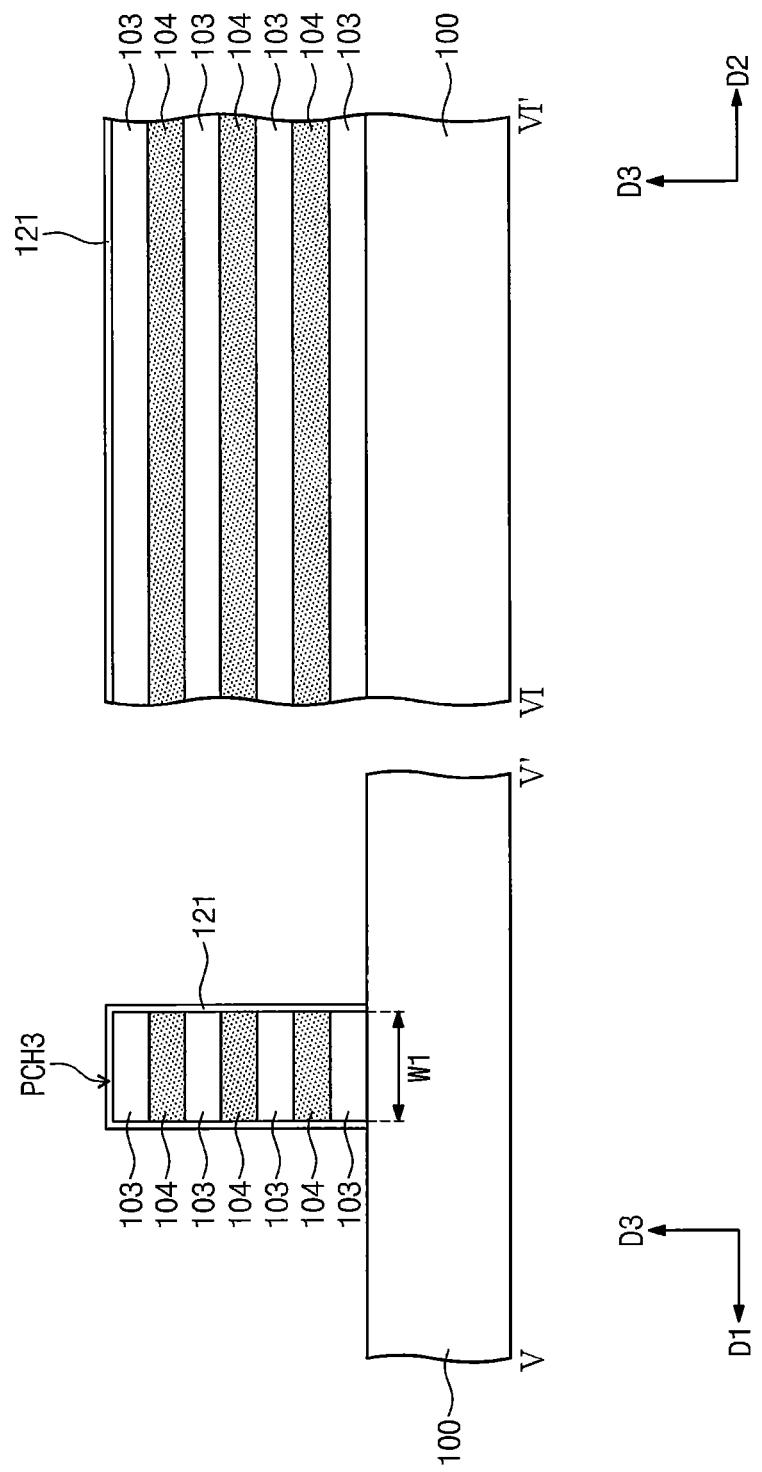

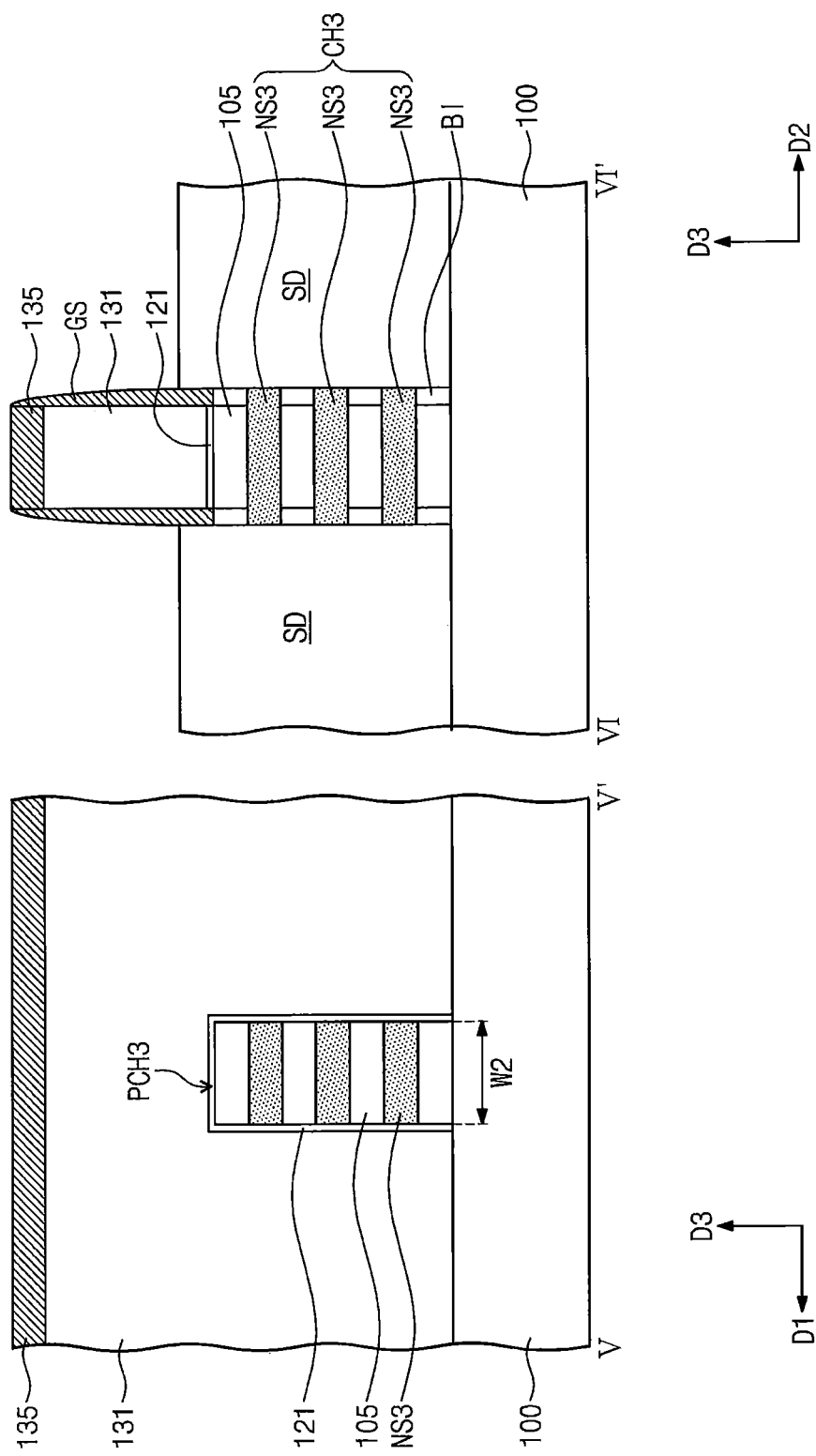

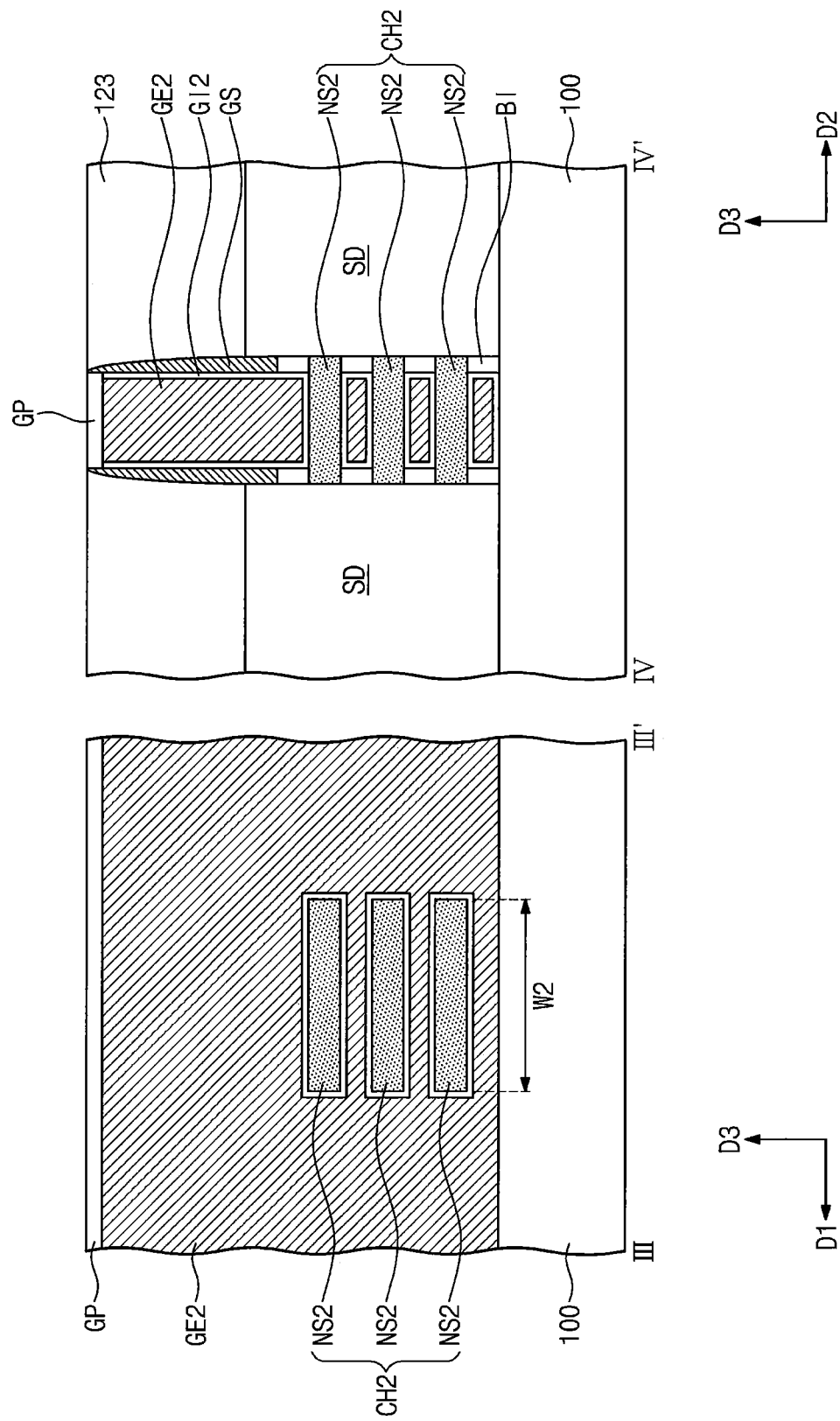

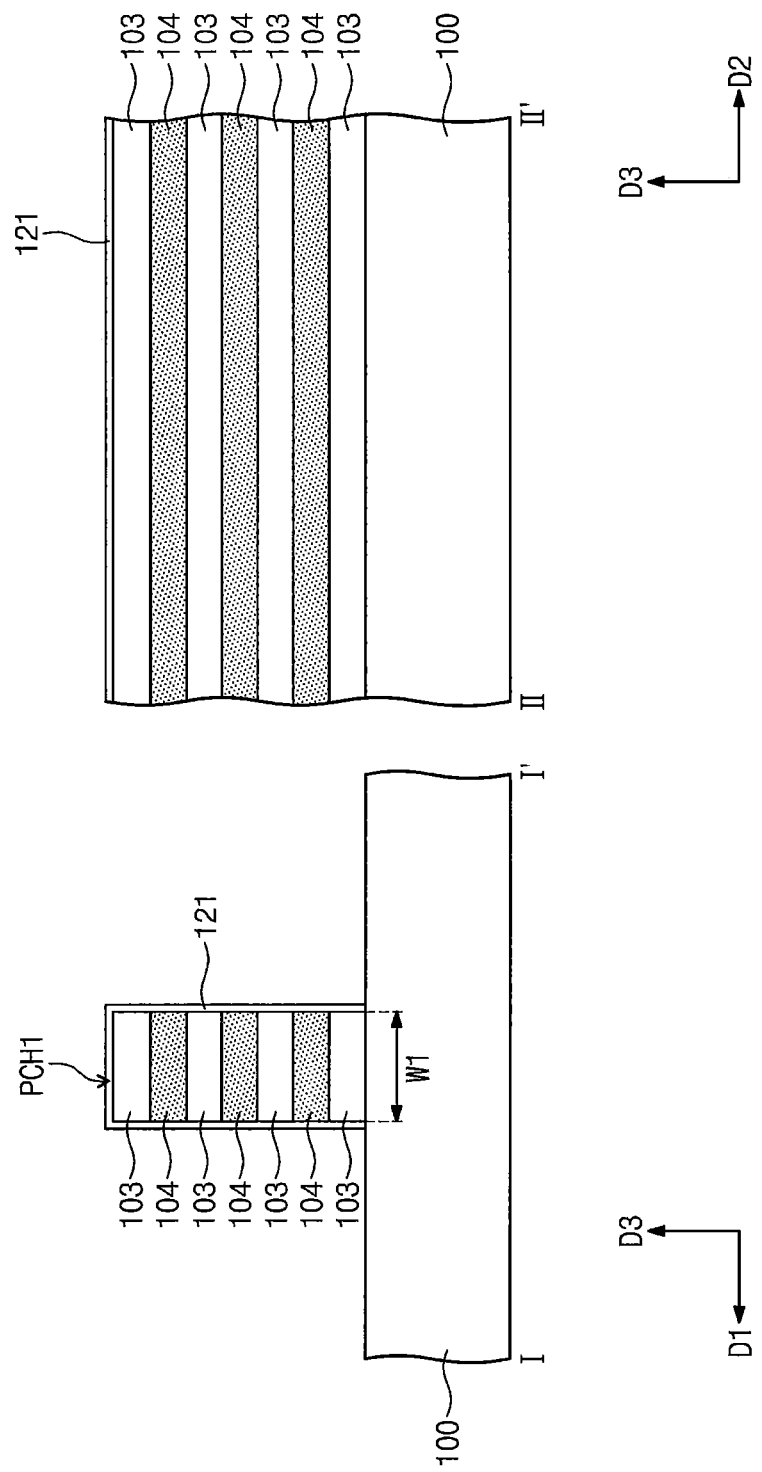

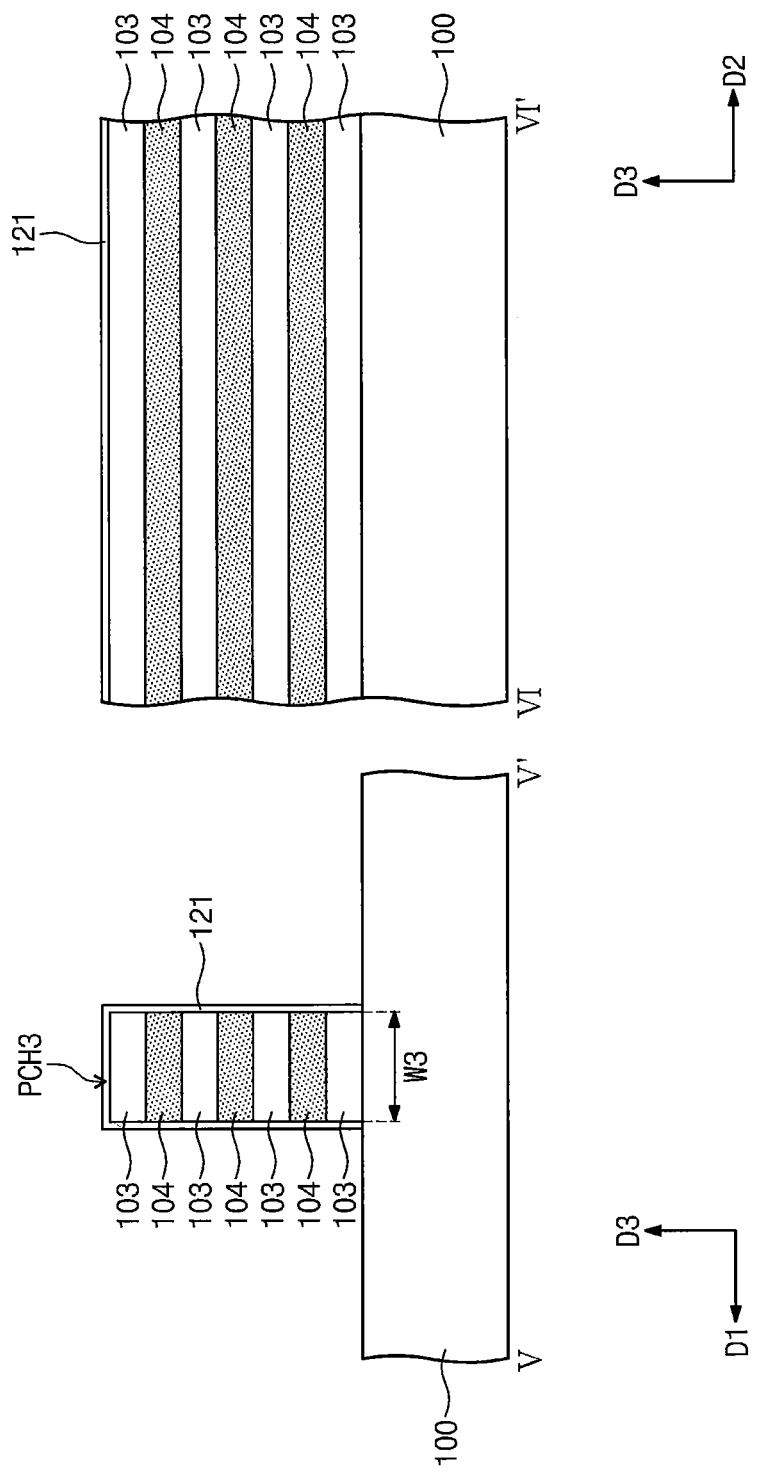

US 10,741,564 B2

SRAM DEVICE PROVIDED WITH A PLURALITY OF SHEETS SERVING AS A CHANNEL REGION

CROSS-REFERENCE TO RELATED APPLICATIONS

This U.S. non-provisional patent application claims priority under 35 U.S.C. § 119 to Korean Patent Application No. 10-2016-0000491, filed on Jan. 4, 2016, in the Korean Intellectual Property Office, the entire disclosure of which is hereby incorporated by reference.

BACKGROUND

The present disclosure relates to semiconductor devices, and in particular, SRAM devices including a plurality of sheets serving as a channel region. The channel region has a width that is dependent on transistor type.

In general, an SRAM device includes two pass-gate transistors, two pull-down transistors, and two pull-up transistors. Although such transistors may be included in the same SRAM device, the technical requirements for the two transistors may not be the same. For example, since an amount of driving current required for operating the pull-up transistor is less than the amount of driving current needed for the pass gate transistor and the pull-down transistor, there is no need for the channel region of the pull-up transistor to have the same structure or size as those of the other transistors. Furthermore, when the pull-up transistor is fabricated to have the same channel region as the other transistors, the SRAM device may suffer from an increase in leakage current and an unnecessary increase in occupying area of a unit cell.

SUMMARY

Some embodiments of the inventive concepts provide an SRAM device including a plurality of semiconductor sheets, which are used as a channel region of a transistor and have a width dependent on a type of the transistor.

According to some embodiments of the inventive concepts, an SRAM device may include a substrate including a first NMOS region, a PMOS region, and a second NMOS region, a first transistor including a first gate structure extending in a first direction on the first NMOS region, first source/drain regions in the first NMOS region on opposite sides of the first gate structure, and a first plurality of semiconductor sheets connecting the first source/drain regions to each other and having a first width in the first direction, a second transistor including a second gate structure extending in the first direction on the first NMOS region, second source/drain regions in the first NMOS region on opposite sides of the second gate structure, and a second plurality of semiconductor sheets connecting the second source/drain regions to each other and having the first width in the first direction, and a third transistor including a third gate structure extending in the first direction on the PMOS region, third source/drain regions in the PMOS region on opposite sides of the third gate structure, and a third plurality of semiconductor sheets connecting the third source/drain regions to each other and having a second width in the first direction. The first width may be greater than the second width.

According to some embodiments of the inventive concepts, an SRAM device may include a substrate including a first NMOS region, a PMOS region, and a second NMOS region, a first transistor including a first gate structure extending in a first direction on the first NMOS region, first source/drain regions in the first NMOS region on opposite sides of the first gate structure, and a first plurality of semiconductor sheets connecting the first source/drain regions to each other and having a first width in the first direction, a second transistor including a second gate structure extending in the first direction on the first NMOS region, second source/drain regions in the first NMOS region on opposite sides of the second gate structure, and a second plurality of semiconductor sheets connecting the second source/drain regions to each other and having a second width in the first direction, and a third transistor including a third gate structure extending in the first direction on the PMOS region, third source/drain regions in the PMOS region on opposite sides of the third gate structure, and a third plurality of semiconductor sheets connecting the third source/drain regions to each other and having a third width in the first direction. The second width may be greater than the first and third widths.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 4A to 8A are sectional views taken along lines I-I' and II-II' of FIG. 2.

FIGS. 4B to 8B are sectional views taken along lines V-V' and IV-IV' of FIG. 2.

FIGS. 4C to 8C are sectional views taken along lines V-V' and VI-VI' of FIG. 2.

FIG. 10B is a sectional view taken along lines III-III' and IV-IV' of FIG. 9.

FIGS. 11A to 14A are sectional views taken along lines I-I' and II-II' of FIG. 9.

FIGS. 11B to 14B are sectional views taken along lines III-III' and IV-IV' of FIG. 9.

FIGS. 11C to 14C are sectional views taken along lines V-V' and VI-VI' of FIG. 9.

DETAILED DESCRIPTION

Figure 1:
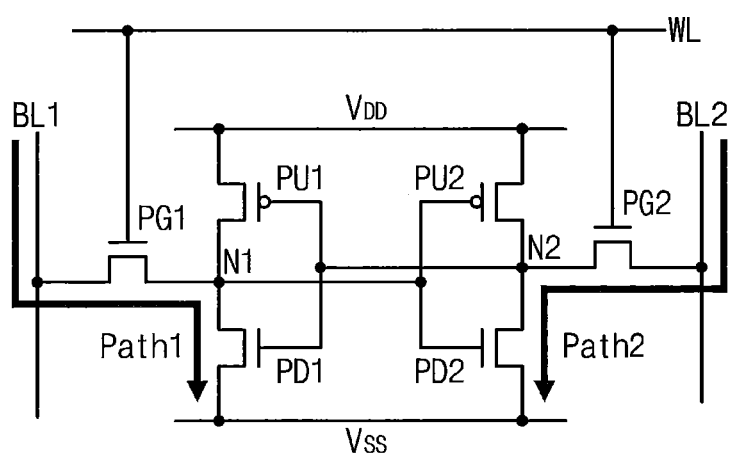
FIG. 1 is an equivalent circuit diagram of an SRAM cell according to some embodiments of the inventive concepts.

Below, example embodiments of inventive concepts will now be described more fully so that those skilled in the art can easily comprehend the inventive concepts FIG. 1 is an equivalent circuit diagram of an SRAM cell according to some embodiments of the inventive concepts. Referring to FIG. 1, an SRAM cell according to some embodiments of the inventive concepts may include a first pull-up transistor PU1, a second pull-up transistor PU2, a first pull-down transistor PD1, a second pull-down transistor PD2, a first pass gate transistor PG1, and a second pass gate transistor PG2. For example, the first pull-up transistor PU1 and the second pull-up transistor PU2 may be PMOS transistors. By contrast, the first pull-down transistor PD1 and the second pull-down transistor PD2 and the first pass gate transistor PG1 and the second pass gate transistor PG2 may be NMOS transistors.

A first voltage (e.g., a power voltage $V_{DD}$) may be supplied to a first terminal of the first pull-up transistor PU1, and a second terminal of the first pull-up transistor PU1 may be connected to a first node N1. A first terminal of the first pull-down transistor PD1 may be connected to the first node N1, and a second voltage (e.g., a ground voltage $V_{SS}$) may be supplied to a second terminal of the first pull-down transistor PD1. A first terminal of the first pass gate transistor PG1 may be connected to a first bit line BL1, and a second terminal of the first pass gate transistor PG1 may be connected to the first node N1.

A gate terminal of the first pull-up transistor PU1 and a gate terminal of the first pull-down transistor PD1 may be electrically connected to a second node N2. As a result, the first pull-up transistor PU1 and the first pull-down transistor PD1 may form a first inverter. The second node N2 may be an input terminal of the first inverter, and the first node N1 may be an output terminal of the first inverter.

The first voltage (e.g., the power voltage $V_{DD}$) may be supplied to a first terminal of the second pull-up transistor PU2, and a second terminal of the second pull-up transistor PU2 may be connected to the second node N2. A first terminal of the second pull-down transistor PD2 may be connected to the second node N2, and the second voltage (e.g., the ground voltage $V_{SS}$) may be supplied to a second terminal of the second pull-down transistor PD2. A first terminal of the second pass gate transistor PG2 may be connected to a second bit line BL2, and a second terminal of the second pass gate transistor PG2 may be connected to the second node N2. For example, the second bit line BL2 may serve as a complementary bit line of the first bit line BL1.

A gate terminal of the second pull-up transistor PU2 and a gate terminal of the second pull-down transistor PD2 may be electrically connected to the first node N1. As a result, the second pull-up transistor PU2 and the second pull-down transistor PD2 may form a second inverter. The first node N1 may be an input terminal of the second inverter, and the second node N2 may be an output terminal of the second inverter.

The first inverter and the second inverter may be configured to serve as a latch. For example, in a writing operation, when the first pass gate transistor PG1 and/or the second pass gate transistor PG2 are turned-on by signals input through a word line WL, signals input through the bit lines BL1 and/or BL2 may be stored in the latch of the first and second inverters. Similarly, in a reading operation, when the first pass gate transistor PG1 and/or the second pass gate transistor PG2 are turned-on by signals input through the word line WL, the signals stored in the latch may be output through the bit lines BL1 and/or BL2.

According to some embodiments of the inventive concepts, the transistors of the SRAM cell may be formed to have at least two different channel widths, and this may make it possible to realize the high performance SRAM cell. For example, two source/drain regions of each transistor may be connected to each other through a multi-stack-sheet type channel region including a plurality of sheets vertically stacked on a substrate. When a gate voltage is applied to a gate electrode enclosing the sheets, a channel region may be formed in the sheets to electrically connect the source/drain regions to each other. In some embodiments, widths of the sheets for the channel region may be determined based on the type of the transistor in which they are provided.

When a writing or reading operation is performed on the SRAM cell, whether the writing or reading operation is properly performed or not may be affected by performance of the NMOS transistor. For example, to read out data from the SRAM cell, a voltage may be applied to both of the bit lines BL1 and BL2. Then, a variation in voltage of in the bit lines BL1 and BL2 may be sensed by a sense amplifier connected to the bit lines BL1 and BL2 to determine whether the data stored in the SRAM cell is in the state of '0' or '1'. In other words, the performance of the SRAM cell may be determined by electrical characteristics of the NMOS transistors PG1, PD1, PG2, and PD2 located on current-discharging paths "Path 1" and "Path2". This may be true in the writing operation of the SRAM cell.

By contrast, there may be no need for the pull-up transistors PU1 and PU2 to have the same high performance as the pass gate transistors PG1 and PG2 and the pull-down transistors PD1 and PD2. That is, the pull-up transistors PU1 and PU2 may not need as much driving current as other transistors. This may mean that the channel region of the pull-up transistors PU1 and PU2 does not need to be enlarged as much as those of the pass gate transistors PG1 and PG2 and the pull-down transistors PD1 and PD2. This may be true in the writing operation of the SRAM cell.

As described above, there may be no need for all of the transistors constituting the SRAM cell to have the same electrical characteristics, and thus, channel widths of transistors may be adjusted to improve operational characteristics of the SRAM cell. Such a SRAM cell with a plurality of stacked sheets will be described in more detail below.

Figure 2:
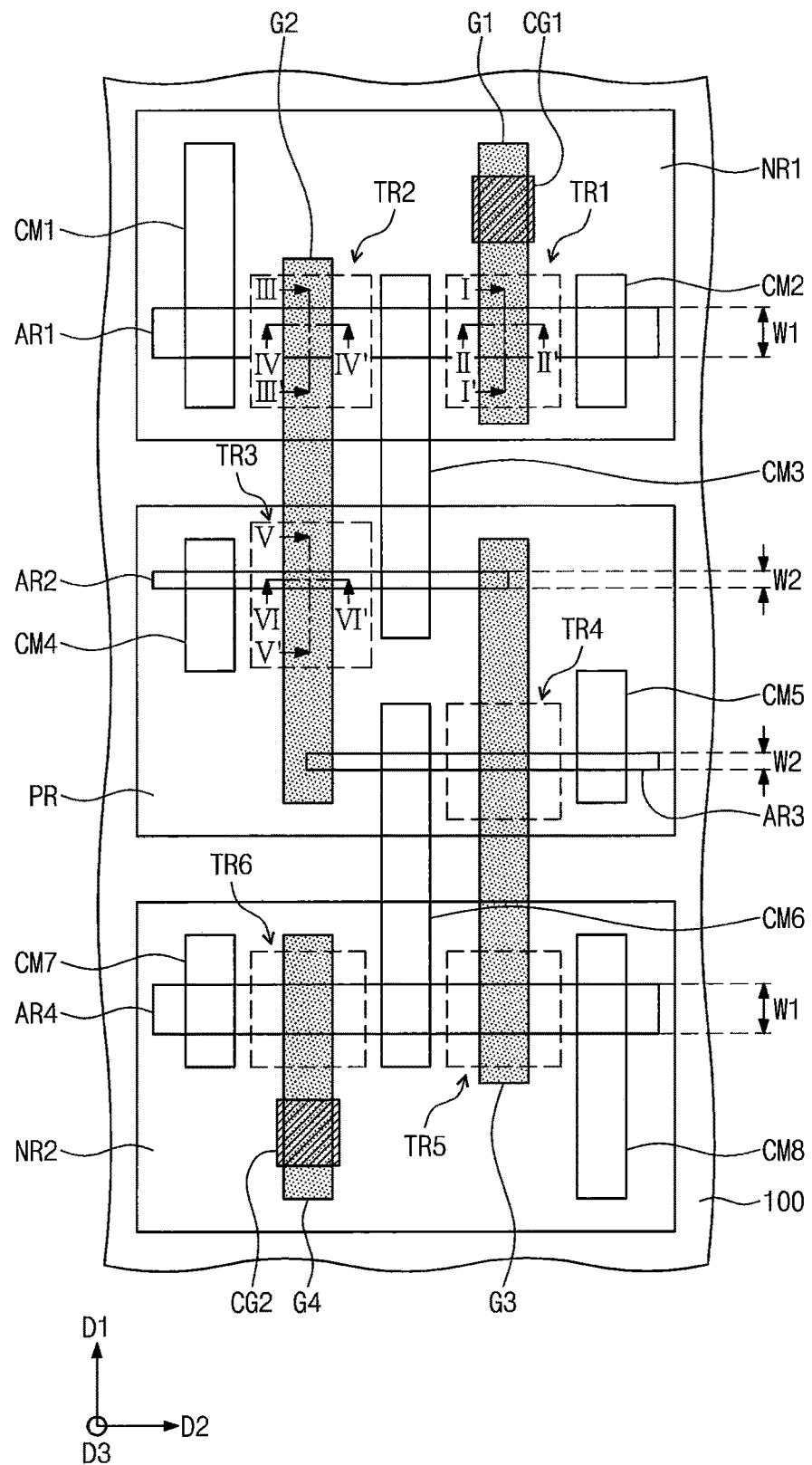
FIG. 2 is a plan view illustrating an example of the SRAM cell of FIG. 1.
Figure 3A:
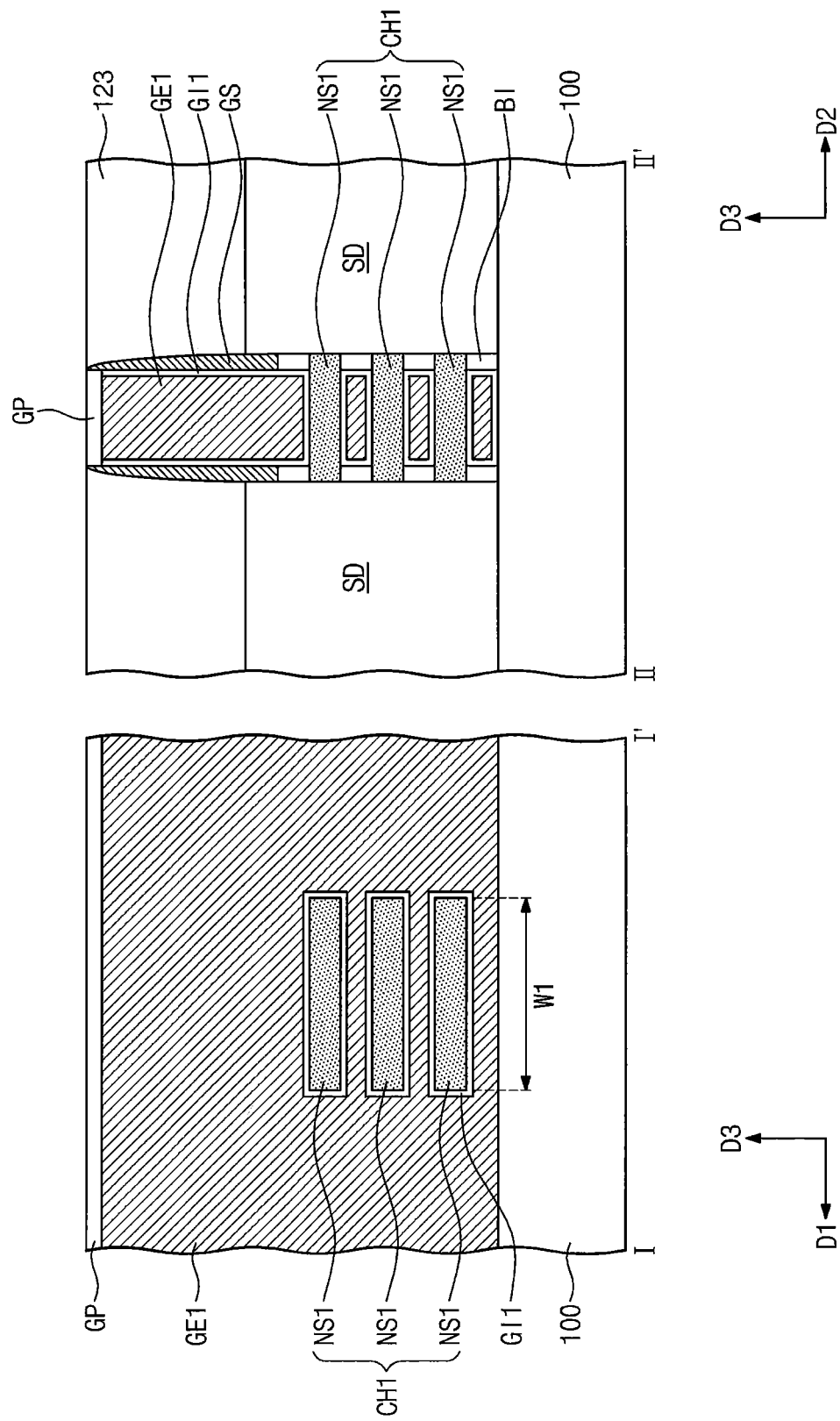
FIG. 3A is a sectional view, taken along lines I-I' and II-II' of FIG. 2.
Figure 3B:
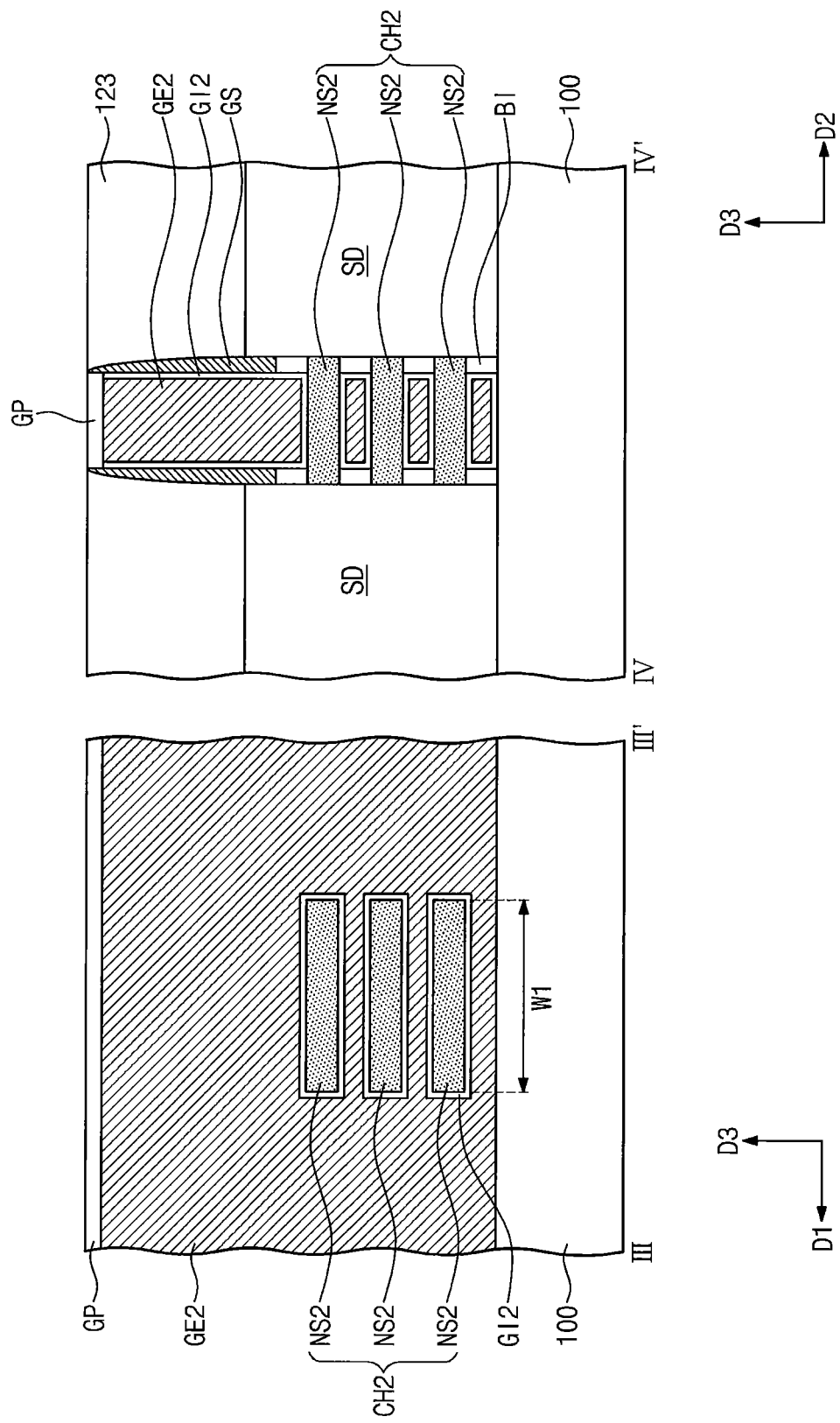
FIG. 3B is a sectional view taken along lines III-III' and IV-IV' of FIG. 2.
Figure 3C:
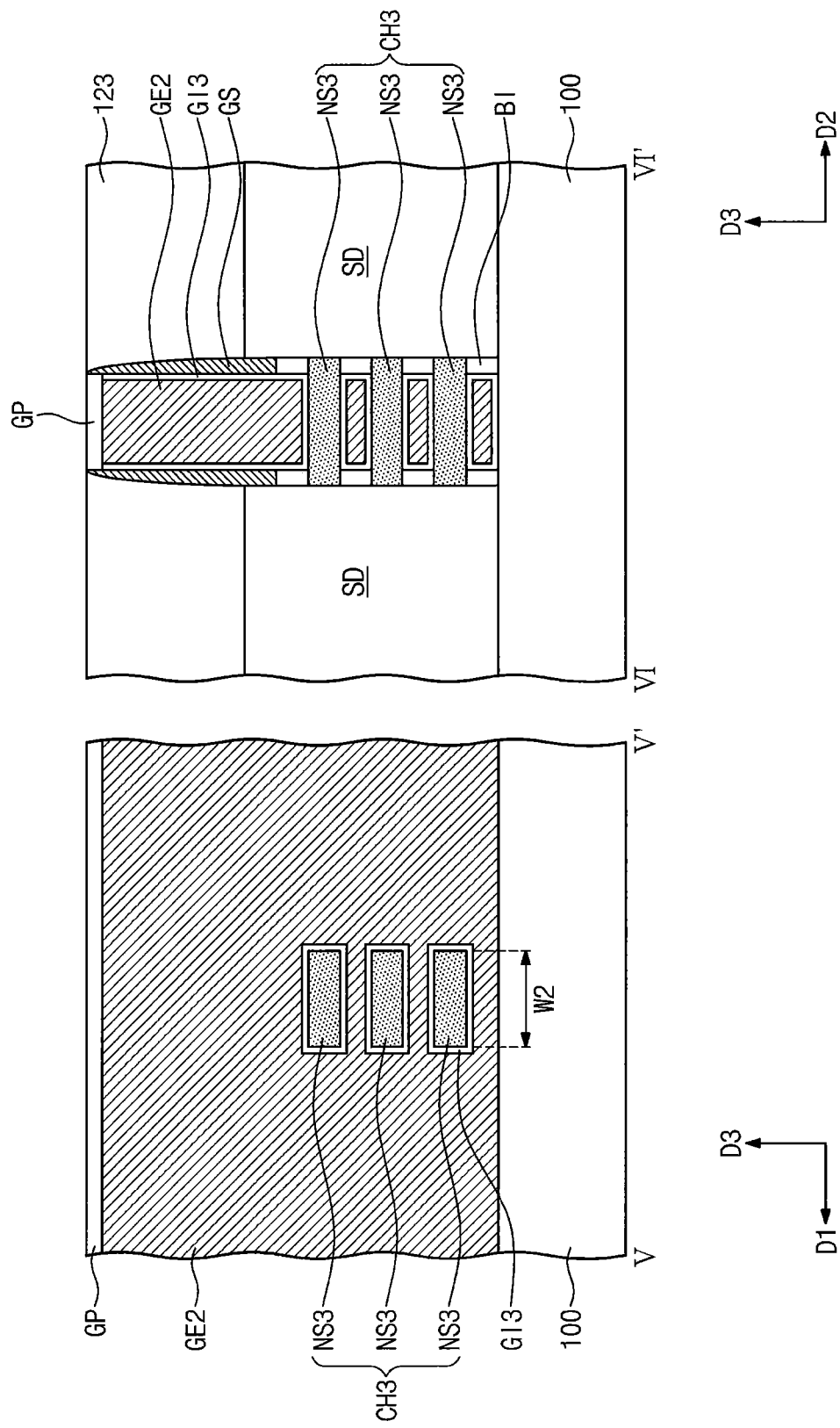
FIG. 3C is a sectional view taken along lines V-V' and VI-VI' of FIG. 2.

FIG. 2 is a plan view illustrating an example of the SRAM cell of FIG. 1. FIG. 3A is a sectional view, taken along lines I-I' and II-II' of FIG. 2. FIG. 3B is a sectional view taken along lines III-III' and IV-IV' of FIG. 2. FIG. 3C is a sectional view taken along lines V-V' and VI-VI' of FIG. 2.

Referring to FIGS. 1 and 2, the SRAM device may include two pass gate transistors TR1 and TR6 of the same structure, two pull-down transistors TR2 and TR5 of the same structure, and two pull-up transistors TR3 and TR4 of the same structure. For example, as shown in FIG. 2, the first and sixth transistors TR1 and TR6 may be provided to have substantially the same structure. Similarly, the second and fifth transistors TR2 and TR5 may be provided to have substantially the same structure, and the third and fourth transistors TR3 and TR4 may be provided to have substantially the same structure. Thus, a detailed description of the fourth to sixth transistors TR4 to TR6 will be omitted, for a concise description.

Referring to FIGS. 2 and 3A to 3C, the first to sixth transistors TR1 to TR6 may be provided on a substrate 100. The first, second, fifth, and sixth transistors TR1, TR2, TR5, and TR6 may be NMOS transistors, and the third and fourth transistors TR3 and TR4 may be PMOS transistors. Since the SRAM cell includes a latch structure with two-coupled inverters as described with reference to FIG. 1, the first transistor TR1 may have a structure similar to the sixth transistor TR6. Also, the second transistor TR2 may have a structure similar to the fifth transistor TR5, and the third transistor TR3 may also have a structure similar to the fourth transistor TR4.

The substrate 100 may include a first NMOS region NR1, a PMOS region PR, and a second NMOS region NR2. The first and second transistors TR1 and TR2 may be provided in the first NMOS region NR1. The third and fourth transistors TR3 and TR4 may be provided in the PMOS region PR. And, the fifth and sixth transistors TR5 and TR6 may be provided in the second NMOS region NR2. In some embodiments, the substrate 100 may be one of a silicon wafer, a germanium wafer, or a silicon-on-insulator (SOI) wafer.

Each of the first to third transistors TR1 to TR3 may include a gate structure extending in a first direction D1, a pair of source/drain regions SD formed on opposite sides of the gate structure, and a channel region connecting the source/drain regions SD to each other. For example, the SRAM device may include first, second, third, and fourth gate structures G1, G2, G3, and G4, each of which includes a gate electrode, a gate insulating layer on side and bottom surfaces of the gate electrode, a gate spacer GS, which is spaced apart from the gate electrode with the gate insulating layer interposed therebetween, and a gate capping pattern GP on the gate electrode and the gate insulating layer. Top surfaces of the gate insulating layer and the gate electrode may be in contact with a bottom surface of the gate capping pattern GP.

Each of the gate electrodes may be formed of or include at least one of a conductive metal nitride or a metal. For example, each of the gate electrodes may be formed of or include at least one of metal nitrides (e.g., TiN, WN, and TaN) or metals (e.g., Ti, W, and Ta). The first to third transistors TR1 to TR3 may include first, second, and third gate electrodes GE1, GE2, and GE3, respectively. In some embodiments, the first to third gate electrodes GE1 to GE3 may include respective layers that are formed of the same material.

The first to third transistors TR1 to TR3 may include first, second, and third gate insulating patterns GI1, GI2, and GI3, respectively. Each of the first to third gate insulating patterns GI1 to GI3 may be formed of or include at least one of a silicon oxide layer, a silicon nitride layer, a silicon oxynitride layer, or high-k dielectric layers. The high-k dielectric layers may have a dielectric constant that is higher than that of the silicon oxide layer; for example, the high-k dielectric layers may include at least one of hafnium oxide (HfO), aluminum oxide (AlO), and tantalum oxide (TaO)). The gate spacer GS and the gate capping pattern GP may be formed of or include at least one of a silicon oxide layer, a silicon nitride layer, or a silicon oxynitride layer.

The SRAM cell may include a first active region AR1 shared by the first and second transistors TR1 and TR2. The first active region AR1 may include a first channel region CH1 and the source/drain regions SD separated by the first channel region CH1. The first active region AR1 may also include a second channel region CH2 and the source/drain regions SD separated by the second channel region CH2. The source/drain regions SD of each of the first and second transistors TR1 and TR2 may be epitaxial patterns, which may be epitaxially grown using the substrate 100 as a seed layer. Furthermore, the source/drain regions SD of each of the first and second transistors TR1 and TR2 may include a material exerting a tensile strain on the first channel region CH1 and the second channel region CH2, respectively. For example, the source/drain regions SD of each of the first and second transistors TR1 and TR2 may include a SiC layer, whose lattice constant is smaller than that of silicon, or a Si layer, whose lattice constant is the same as that of the substrate 100. An interlayer insulating layer 123 may be provided on the source/drain regions SD. The gate structure may be provided in the interlayer insulating layer 123. The interlayer insulating layer 123 may have a top surface that is substantially coplanar with that of the gate capping pattern GP. The interlayer insulating layer 123 may be formed of or include a silicon oxide layer or a silicon oxynitride layer.

The SRAM cell may include a second active region AR2, which is used as a part of the third transistor TR3. The second active region AR2 may include a third channel region CH3 and the source/drain regions SD separated by the third channel region CH3. The source/drain regions SD of each of the third transistor TR3 may be epitaxial patterns, which may be epitaxially grown using the substrate 100 as a seed layer. The source/drain regions SD of the third transistor TR3 may include a material exerting a compressive strain on the third channel region CH3. For example, the source/drain regions SD of the third transistor TR3 may include a SiGe layer, whose lattice constant is larger than that of silicon. The interlayer insulating layer 123 may be provided on the source/drain regions SD. The gate structure may be provided in the interlayer insulating layer 123. The top surface of the interlayer insulating layer 123 may be substantially coplanar with that of the gate capping pattern GP. The interlayer insulating layer 123 may be formed of or include a silicon oxide layer or a silicon oxynitride layer.

The first to third transistors TR1 to TR3 may be provided to have different channel widths. As shown in FIGS. 2 and 3A to 3C, the first and second transistors TR1 and TR2 may be provided to share the first active region AR1. In this case, the first and second transistors TR1 and TR2 may have the same channel width of W1, when measured in the first direction D1). The second active region AR2 may be used as a part of the third transistor TR3. In this case, the third transistor TR3 may have a channel width of W2, when measured in the first direction D1. In some embodiments, the width W1 may be about 1.4 to about 10 times the width W2, but the inventive concepts are not limited thereto.

Each of the first to third channel regions CH1 to CH3 may include a plurality of sheets, which are vertically stacked on the substrate 100 and are vertically spaced apart from each other. For example, the first channel region CH1 may include three first sheets NS1, the second channel region CH2 may include three second sheets NS2, and the third channel region CH3 may include three third sheets NS3. Although each channel region is illustrated to have three sheets, the inventive concepts are not limited thereto. In certain embodiments, the sheets of each channel may have substantially the same or similar impurity concentrations.

The first to third sheets NS1 to NS3 may be spaced apart from the top surface of the substrate 100. Each of the first to third sheets NS1 to NS3 may include at least one sheet that originates from the same semiconductor layer and is positioned at the same level from the substrate 100. For example, the lowermost sheets of the first to third sheets NS1 to NS3 may be positioned at the same level from the substrate 100. The first to third sheets NS1 to NS3 may be formed of or include at least one of Si, SiGe, or Ge. The first sheets NS1 may be provided to have substantially the same thickness, but the inventive concepts are not limited thereto. For the second and third sheets NS2 and NS3, this may be true.

The first gate electrode GE1 may be provided to enclose or surround each of the first sheets NS1 and to extend in the first direction D1. Barrier insulating patterns BI may be provided between the source/drain regions SD and the first gate electrode GE1. The barrier insulating patterns BI may be spaced apart from each other by the first sheets NS1, the second sheets NS2, or the third sheets NS3. In other words, the first transistor TR1 may be a gate-all-around type field effect transistor (GAA-type FET), in which a gate electrode is provided to surround an outer surface of a channel region. Similarly, outer surfaces of the second and third channel regions CH2 and CH3 may be surrounded by the second and third gate electrodes GE2 and GE3, respectively, and thus, the second and third transistors TR2 and TR3 may also be GAA-type FETs. In some embodiments, the first to third gate electrodes GE1 to GE3 may be provided to extend in the first direction D1.

Referring further to FIGS. 1 and 2, the SRAM cell may further include other elements. For example, as shown in FIG. 2, a first metal contact CM1 may be connected to at an end portion of the first active region AR1. The first metal contact CM1 may be applied with the ground voltage $V_{SS}$. In addition, a second metal contact CM2 may be connected to an opposite end portion of the first active region AR1. The second metal contact CM2 may be connected to the first bit line BL1. A fourth metal contact CM4 may be connected to an end portion of the second active region AR2. The power voltage $V_{DD}$ may be applied to the fourth metal contact CM4. Furthermore, a third metal contact CM3 may be provided to connect the second active region AR2 to a portion of the first active region AR1 between the first and second transistors TR1 and TR2. A first gate contact CG1 may be provided on the first gate electrode GE1. The first gate contact CG1 may be connected to the word line WL.

A fifth metal contact CM5 may be connected to an end portion of a third active region AR3. The power voltage $V_{DD}$ may be applied to the fifth metal contact CM5. In addition, a sixth metal contact CM6 may be provided to connect the third active region AR3 to a portion of a fourth active region AR4 between the fifth and sixth transistors TR5 and TR6. A seventh metal contact CM7 may be connected to an end portion of the fourth active region AR4. The seventh metal contact CM7 may be connected to the second bit line BL2. An eighth metal contact CM8 may be connected to an opposite end portion of the fourth active region AR4. The eighth metal contact CM8 may be applied with the ground voltage $V_{SS}$.

According to some embodiments of the inventive concepts, a plurality of sheets may be used as a channel region of each transistor of the SRAM cell. However, a width of the channel region or the sheets of the SRAM cell may be determined based on a type of the transistor; for example, the pass gate transistor, the pull-up transistor, or the pull-down transistor of the SRAM cell may have different channel widths. This may make it possible to improve performance of the SRAM cell and/or to reduce an occupying area of the SRAM cell.

FIGS. 4A to 8A are sectional views taken along lines I-I' and II-II' of FIG. 2. FIGS. 4B to 8B are sectional views taken along lines III-III' and IV-IV' of FIG. 2. FIGS. 4C to 8C are sectional views taken along lines V-V' and VI-VI' of FIG. 2. Hereinafter, a method of fabricating a SRAM cell, according to some embodiments of the inventive concepts, will be described with reference to FIGS. 2 and 4A to 8C.

Figure 4B:
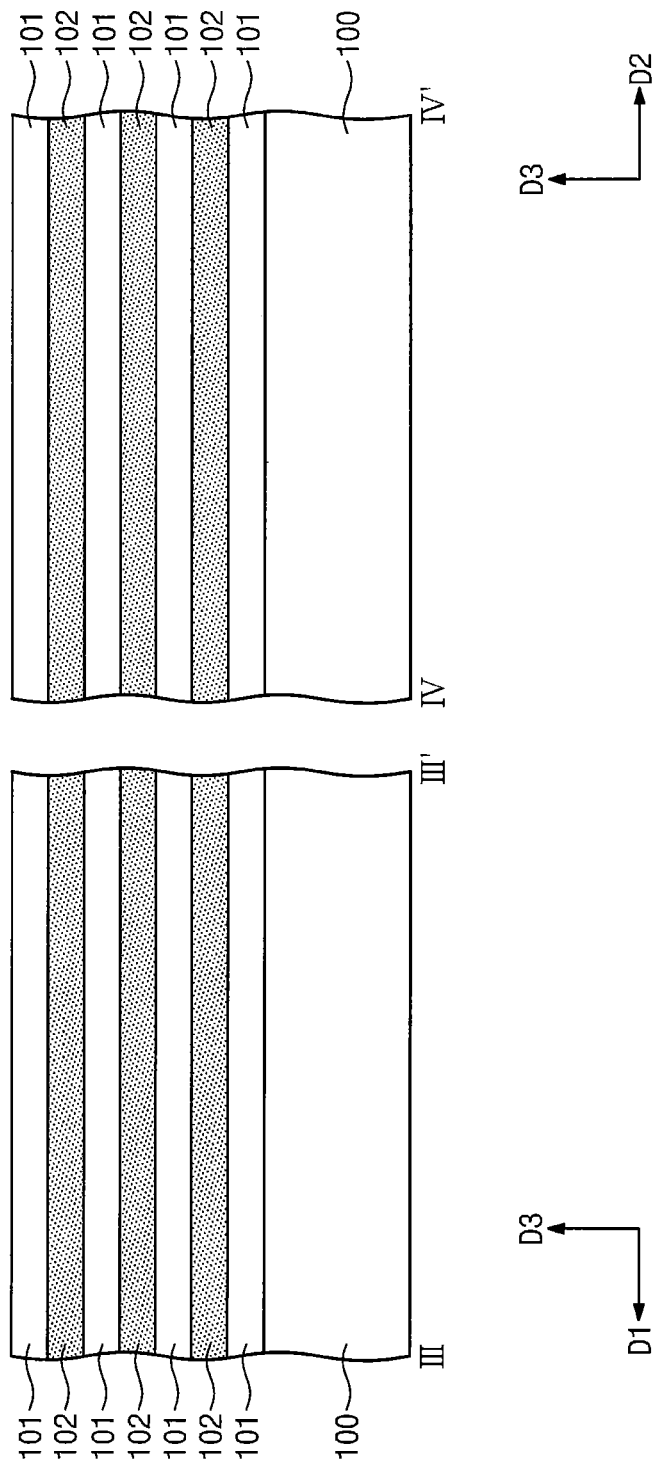
Figure 4C:
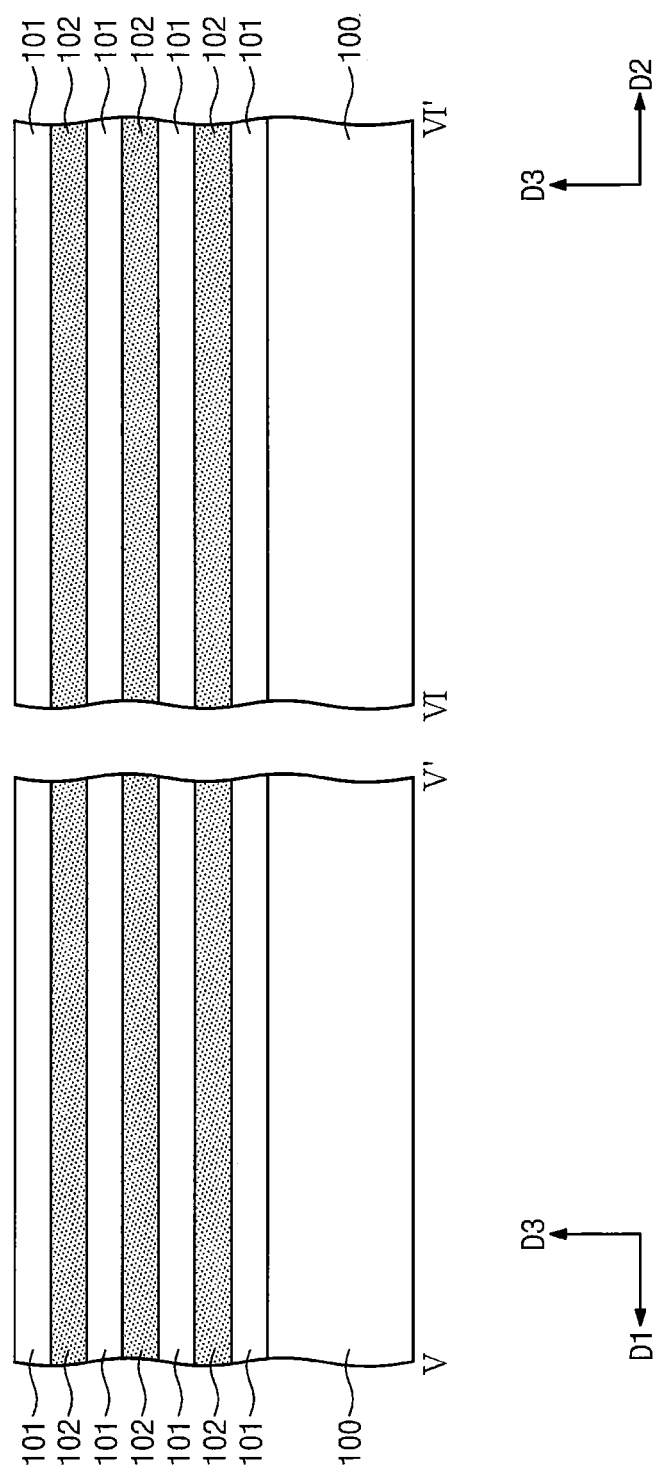
Figure 5A:
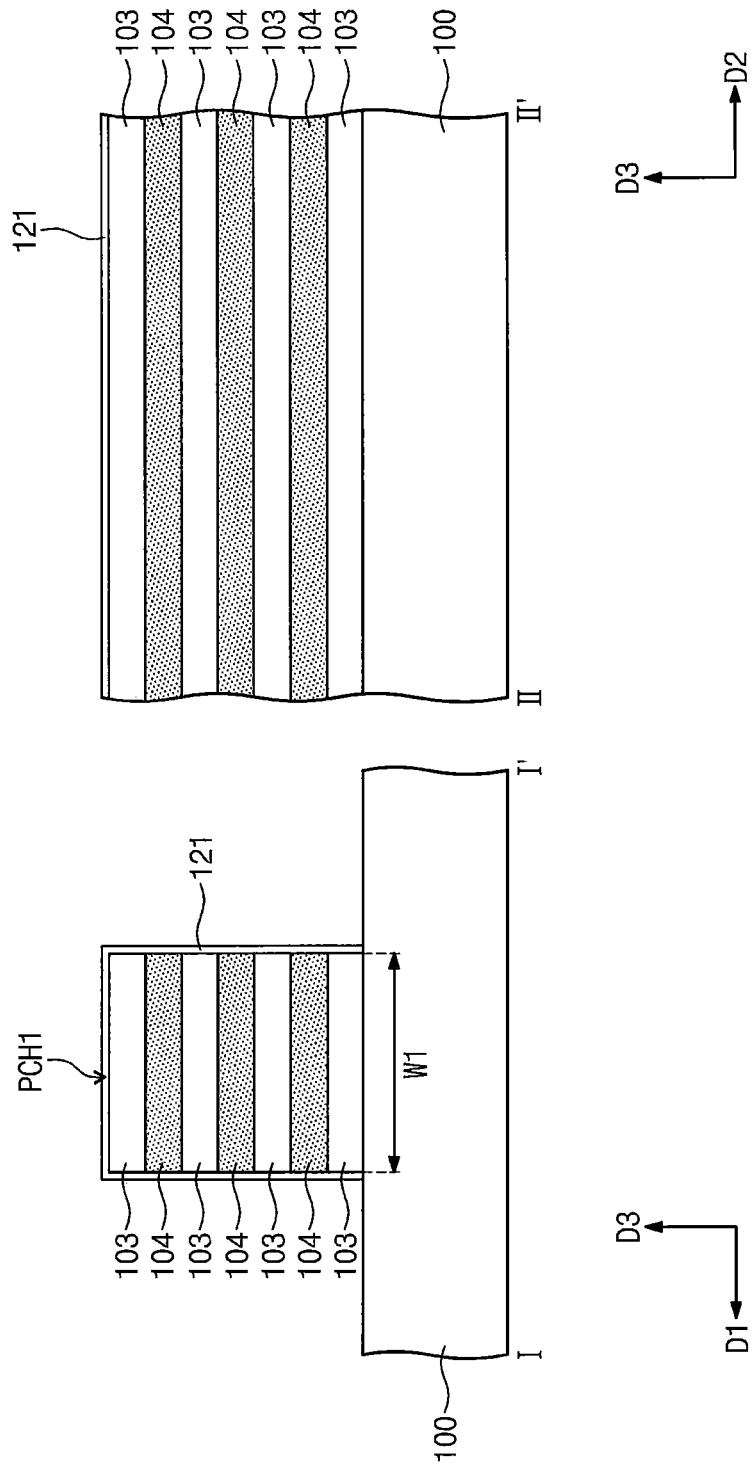
Figure 5B:
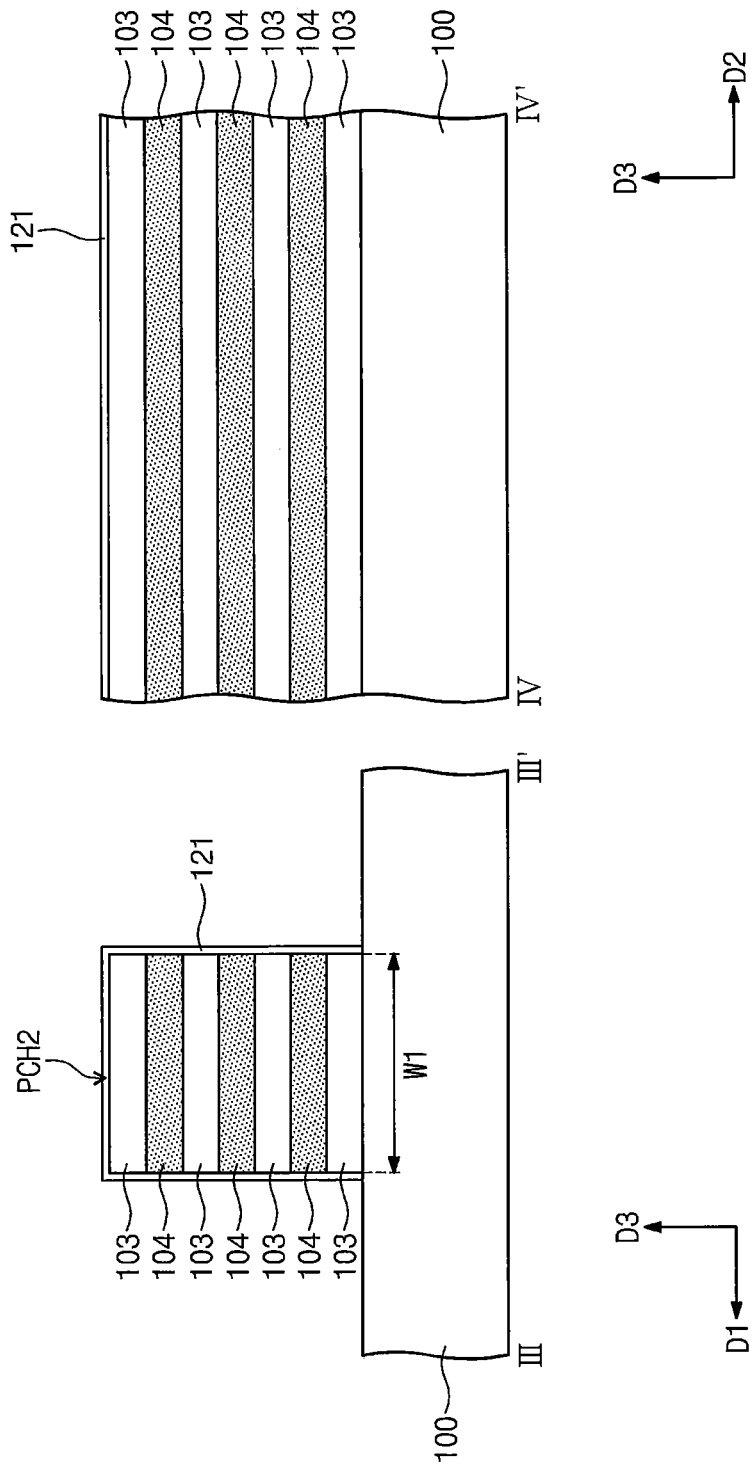

Referring to FIGS. 2 and 4A to 4C, a plurality of sacrificial layers 101 and a plurality of semiconductor layers 102 may be alternatingly and repeatedly formed on the substrate 100. As shown in FIGS. 4A to 4C, three semiconductor layers 102 may be stacked on the substrate 100, but the inventive concepts are not limited thereto. For example, the stacking number of the semiconductor layers 102 may be changed depending on the number of the sheet constituting the channel region. The sacrificial layers 101 may include a material having an etch selectivity with respect to the first semiconductor layers 102. For example, when the sacrificial layers 101 are etched in a subsequent process, materials for the sacrificial and semiconductor layers 101 and 102 may be selected to selectively remove the sacrificial layers 101 and to suppress the first semiconductor layers 102 from being etched. The etch selectivity may be quantitatively expressed in terms of a ratio of an etch rate of the first semiconductor layers 102 to an etch rate of the sacrificial layers 101 for a given etch process. For example, the sacrificial layers 101 may be formed of or include a material having the etch selectivity of 1:10 to 1:200, with respect to the first semiconductor layers 102. In some embodiments, the sacrificial layers 101 may be formed of or include at least one of SiGe, Si, or Ge, and the first semiconductor layers 102 may be formed of or include at least one of SiGe, Si, or Ge but the material for the first semiconductor layers 102 may be different from that for the sacrificial layers 101.

The sacrificial layers 101 and the first semiconductor layers 102 may be formed by an epitaxial growth process using the substrate 100 as a seed layer. For example, the epitaxial growth process may include a chemical vapor deposition (CVD) process or a molecular beam epitaxy (MBE) process. The sacrificial layers 101 and the first semiconductor layers 102 may be formed in situ in the same chamber. In certain embodiments, the sacrificial layers 101 and the first semiconductor layers 102 may be conformally formed on the entire top surface of the substrate 100. For example, the sacrificial layers 101 and the first semiconductor layers 102 may be formed to have substantially the same thickness, but the inventive concepts are not limited thereto.

Referring to FIGS. 2 and 5A to 5C, a patterning process may be performed on the sacrificial layers 101 and the semiconductor layers 102. As a result, first, second, and third preliminary channel regions PCH1, PCH2, and PCH3 may be formed at regions for the first to third transistors TR1 to TR3. The patterning process may include an anisotropic dry etching process, in which a mask pattern (not shown) defining the first to third preliminary channel regions PCH1 to PCH3 is used. As a result of the etching process, preliminary sacrificial patterns 103 and first semiconductor patterns 104 may be formed from the sacrificial layers 101 and the first semiconductor layers 102. The first and second preliminary channel regions PCH1 and PCH2 may be formed to have a first width W1 in the first direction D1. The third preliminary channel region PCH3 may be formed to have a second width W2 in the first direction D1. The first width W1 may be greater than the second width W2. For example, the first width W1 may be about 1.4 to about 10 times the second width W2.

Capping insulating layers 121 may be formed on the first to third preliminary channel regions PCH1 to PCH3, respectively, after the patterning process. For example, the capping insulating layers 121 may be formed by a thermal oxidation process. In some embodiments, the capping insulating layer 121 may be formed of or include a silicon oxide layer or a silicon-germanium oxide layer. However, the inventive concepts are not limited thereto; for example, the capping insulating layers 121 may be formed by a deposition process.

Referring to FIGS. 2 and 6A to 6C, dummy gates 131 may be formed. The dummy gates 131 may be a line- or bar-shaped structure extending in the first direction D1. Gate mask patterns 135 may be formed on the dummy gates 131. The formation of the dummy gates 131 and the gate mask patterns 135 may include sequentially forming a dummy gate layer and a gate mask layer on the substrate 100 and patterning the dummy gate layer and the gate mask layer. The dummy gate layer may be formed of or include a polysilicon layer. The gate mask layer may be formed of or include a silicon nitride layer or a silicon oxynitride layer. In certain embodiments, the capping insulating layers 121 may be partially etched during the process of patterning the dummy gate layer and the gate mask layer.

The gate spacers GS may be formed on side surfaces of the dummy gates 131. The gate spacers GS may be formed of or include at least one of a silicon oxide layer, a silicon nitride layer, or a silicon oxynitride layer. The formation of the gate spacers GS may include forming a spacer layer using a deposition process, for example, like CVD (chemical vapor deposition) or ALD (Atomic Layer Deposition), and performing an anisotropic etching process on the spacer layer.

The first to third preliminary channel regions PCH1 to PCH3 may be etched using the gate mask patterns 135 and the gate spacers GS as an etch mask. The first to third channel regions CH1 to CH3 may be formed as a result of the etching of the first to third preliminary channel regions PCH1 to PCH3. For example, the preliminary sacrificial patterns 103 and the first semiconductor patterns 104 on the first preliminary channel region PCH1 may be etched to form sacrificial patterns 105 and the first sheets NS1. Similarly, the preliminary sacrificial patterns 103 and the first semiconductor patterns 104 on the second preliminary channel region PCH2 may be etched to form the sacrificial patterns 105 and first sheets NS2. Similarly, the preliminary sacrificial patterns 103 and the first semiconductor patterns 104 on the third preliminary channel region PCH3 may be etched to form the sacrificial patterns 105 and the third sheets NS3.

Figure 6A:
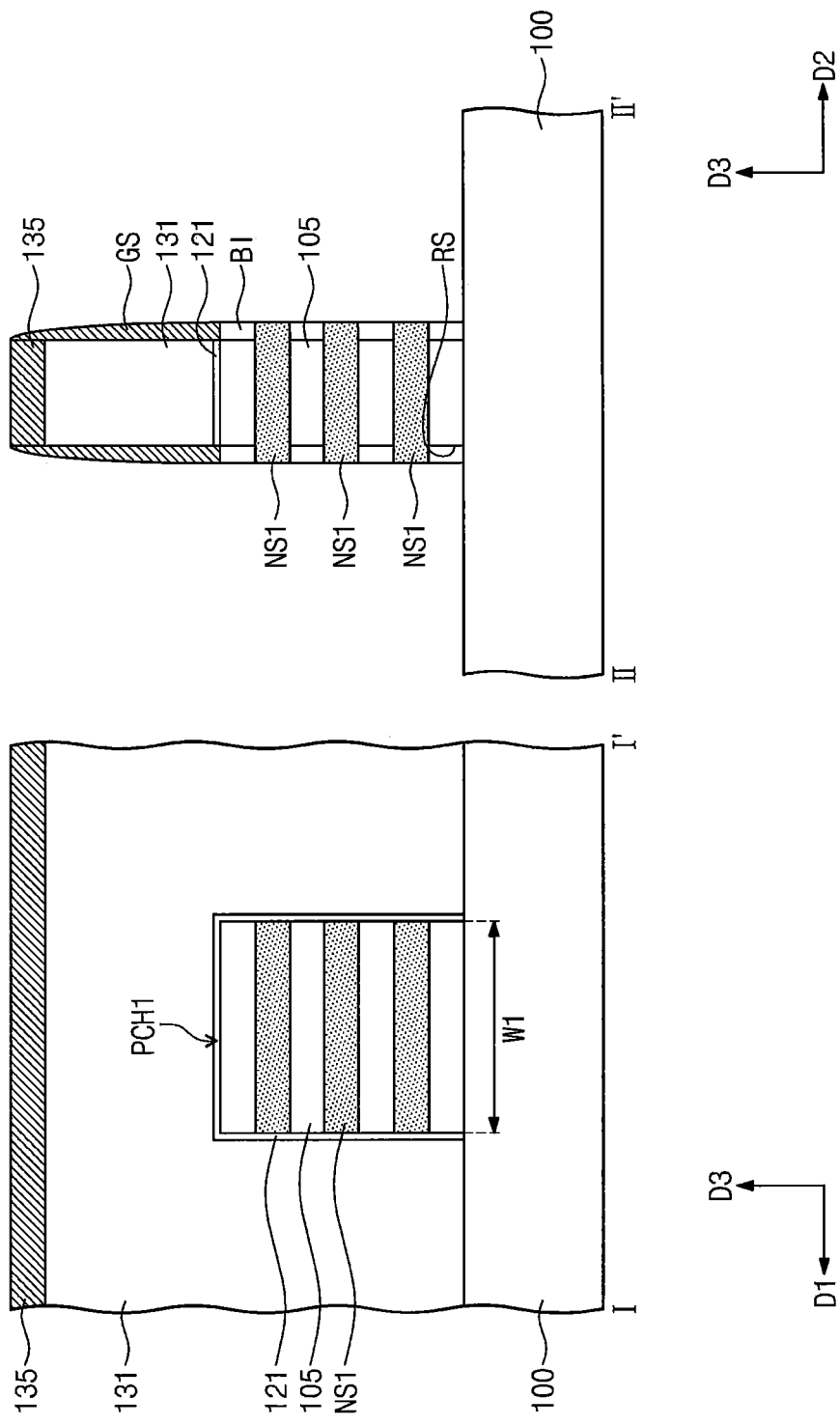
Figure 6B:
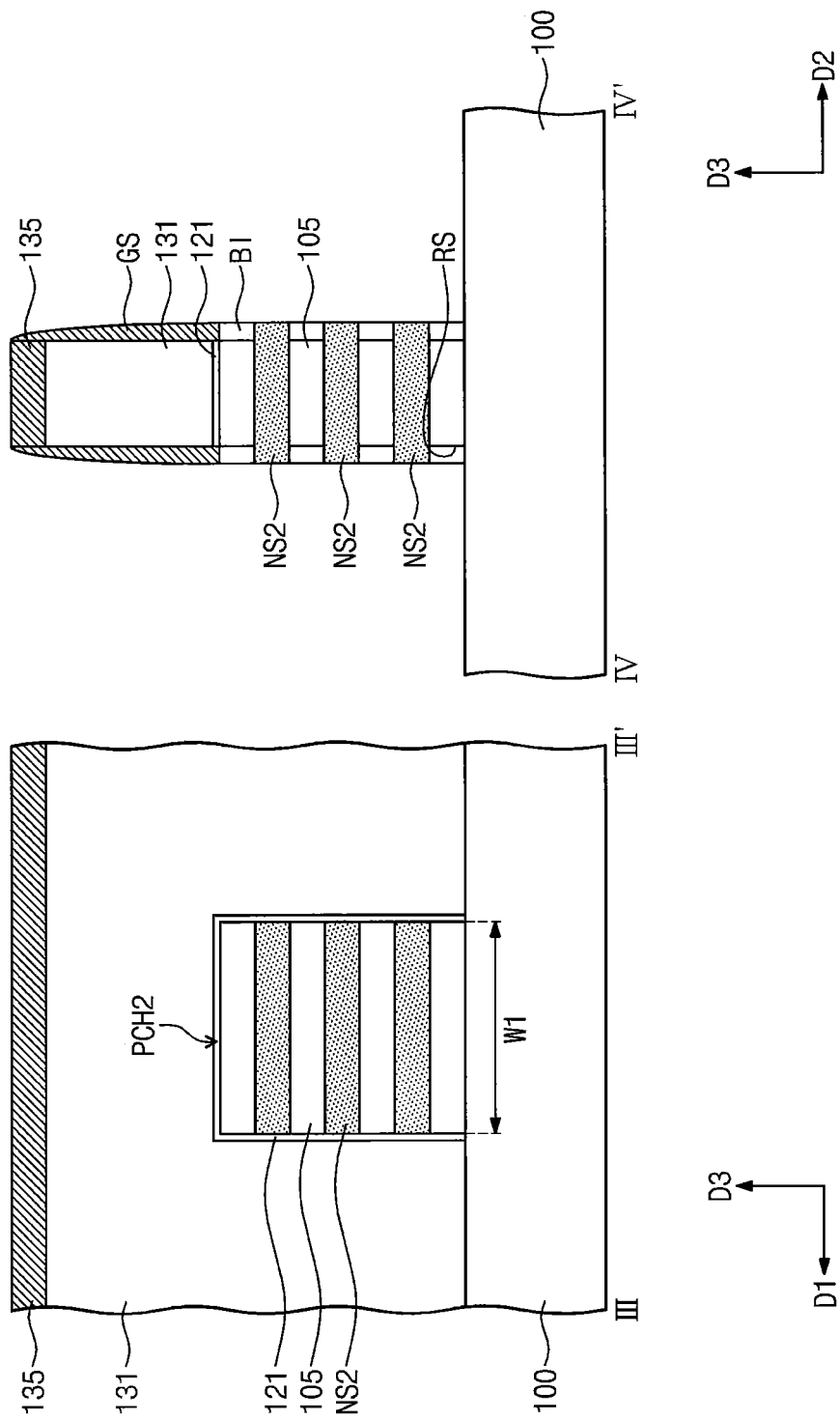
Figure 6C:
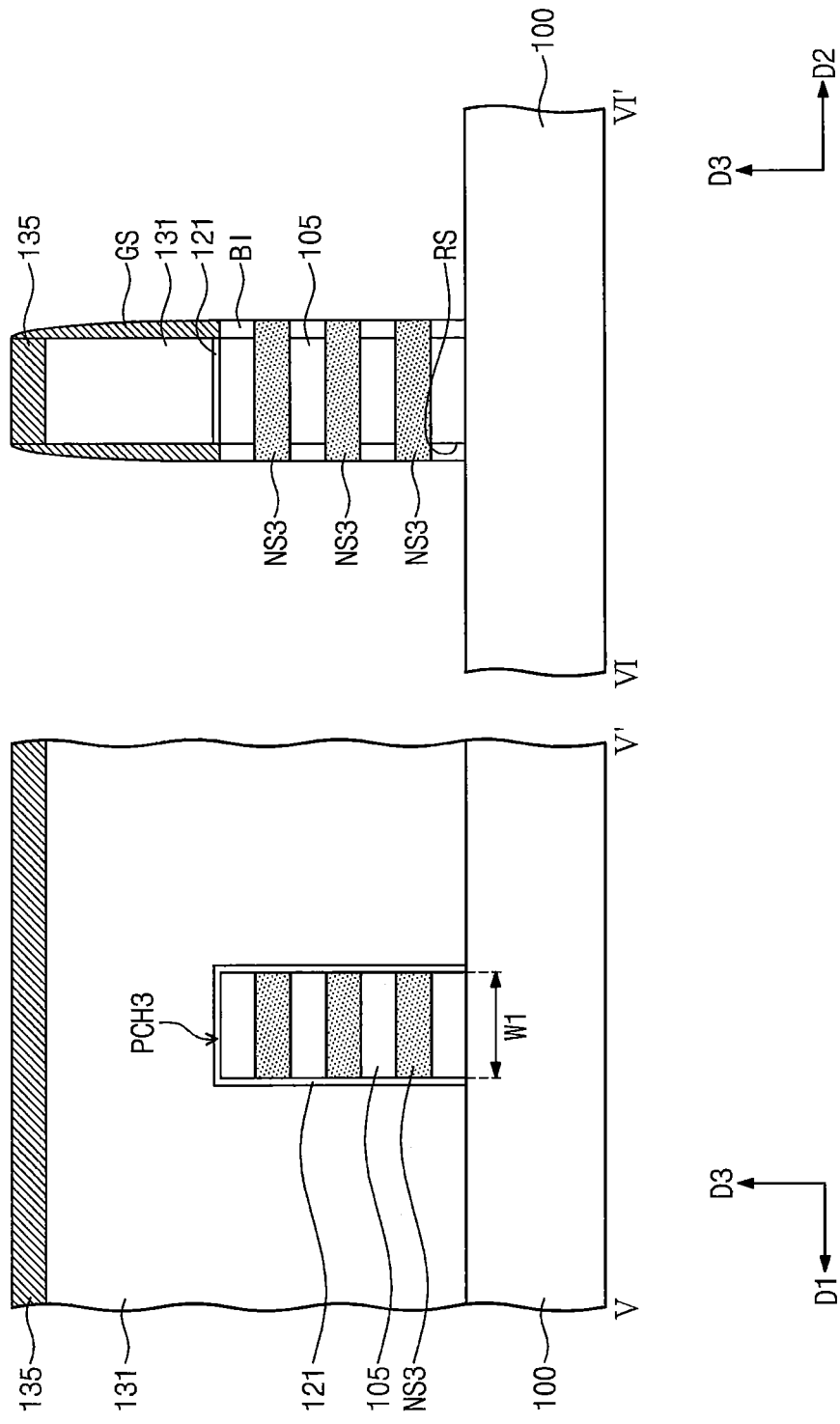

As shown in FIGS. 6A to 6C, the first and second sheets NS1 and NS2 may have the first width W1 in the first direction D1, and the third sheets NS3 may have the second width W2 in the first direction D1. The first width W1 may be greater than the second width W2. For example, the first width W1 may be about 1.4 to about 10 times the second width W2, but the inventive concepts are not limited thereto.

In some embodiments, recess regions RS may be formed by laterally etching the sacrificial patterns 105. The recess regions RS may be formed using an etchant capable of selectively etching the sacrificial patterns 105. For example, in the case where the first to third sheets NS1 to NS3 include silicon (Si) and the sacrificial patterns 105 include silicon germanium (SiGe), the recess regions RS may be formed by using and etching solution containing peracetic acid.

The barrier insulating patterns BI may be formed in the recess regions RS, respectively. The barrier insulating patterns BI may be vertically separated from each other, between two adjacent ones of the first sheets NS1, between the first sheet NS1 and the substrate 100, or between the first sheet NS1 and the gate spacer GS. This may be true, for the second and third sheets NS2 and NS3. The barrier insulating patterns BI may be formed of or include at least one of a silicon oxide layer, a silicon nitride layer, or a silicon oxynitride layer. The formation of the barrier insulating patterns BI may include conformally forming an insulating layer on the resulting structure with the recess regions RS and performing an anisotropic etching process on the insulating layer.

Referring to FIGS. 2 and 7A to 7C, the source/drain regions SD may be formed on opposite sides of each of the dummy gates 131. The source/drain regions SD may be formed by a selective epitaxial process using the substrate 100 as a seed layer. For example, the source/drain regions SD of the first transistor TR1 may be formed of or include a material capable of exerting a tensile strain to the first channel region CH1, and the source/drain regions SD of the second transistor TR2 may be formed of or include a material capable of exerting a tensile strain to the second channel region CH2. For example, the source/drain regions SD of the first and second transistors TR1 and TR2 may include a SiC layer, whose lattice constant is smaller than that of silicon, or a Si layer, whose lattice constant is the same as that of the substrate 100. By contrast, the source/drain regions SD of the third transistor TR3 may be formed of or include a material capable of exerting a compressive strain to the third channel region CH3. For example, the source/drain regions SD of the third transistor TR3 may include a SiGe layer, whose lattice constant is larger than that of silicon.

Figure 7A:
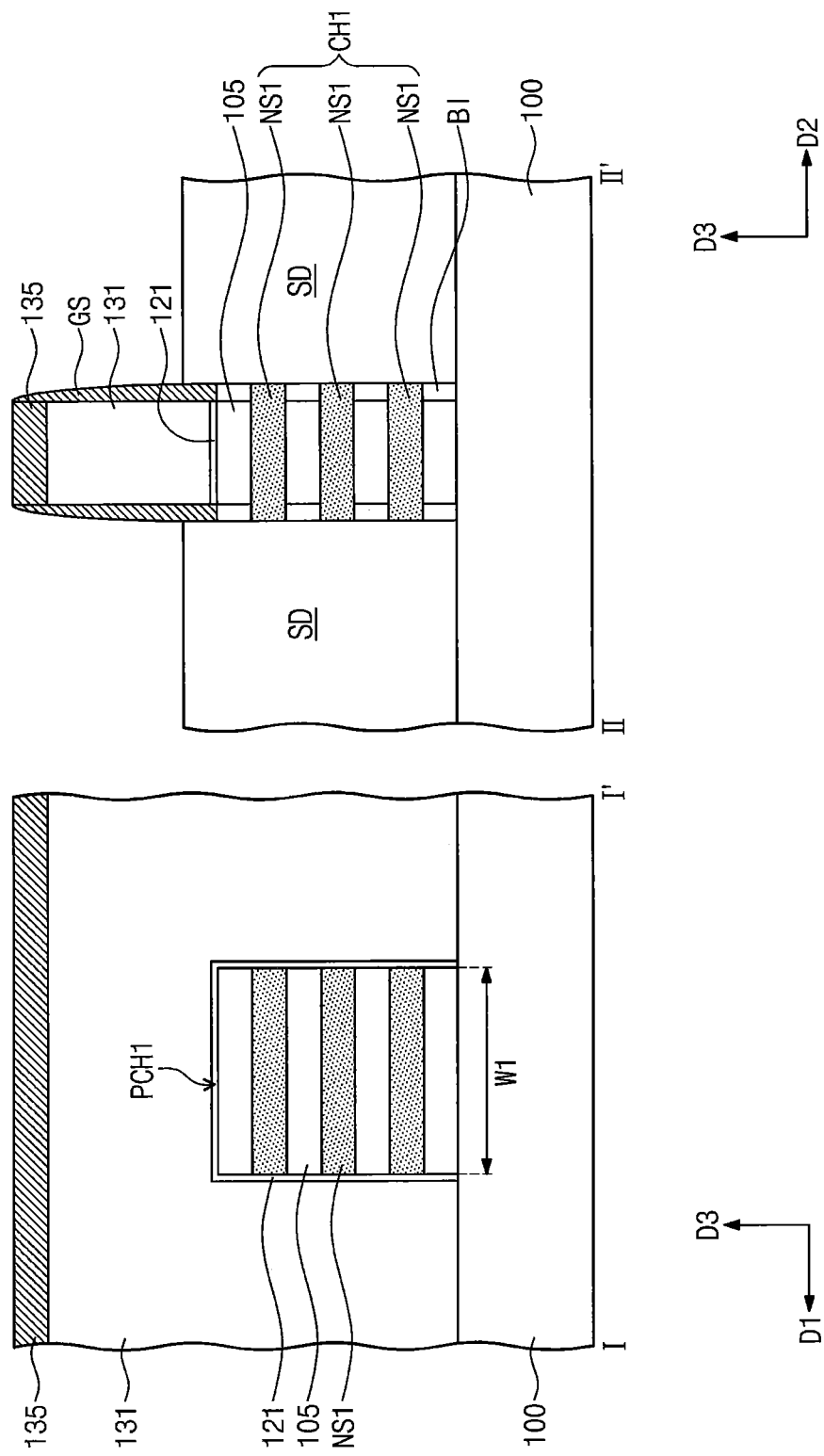
Figure 7B:
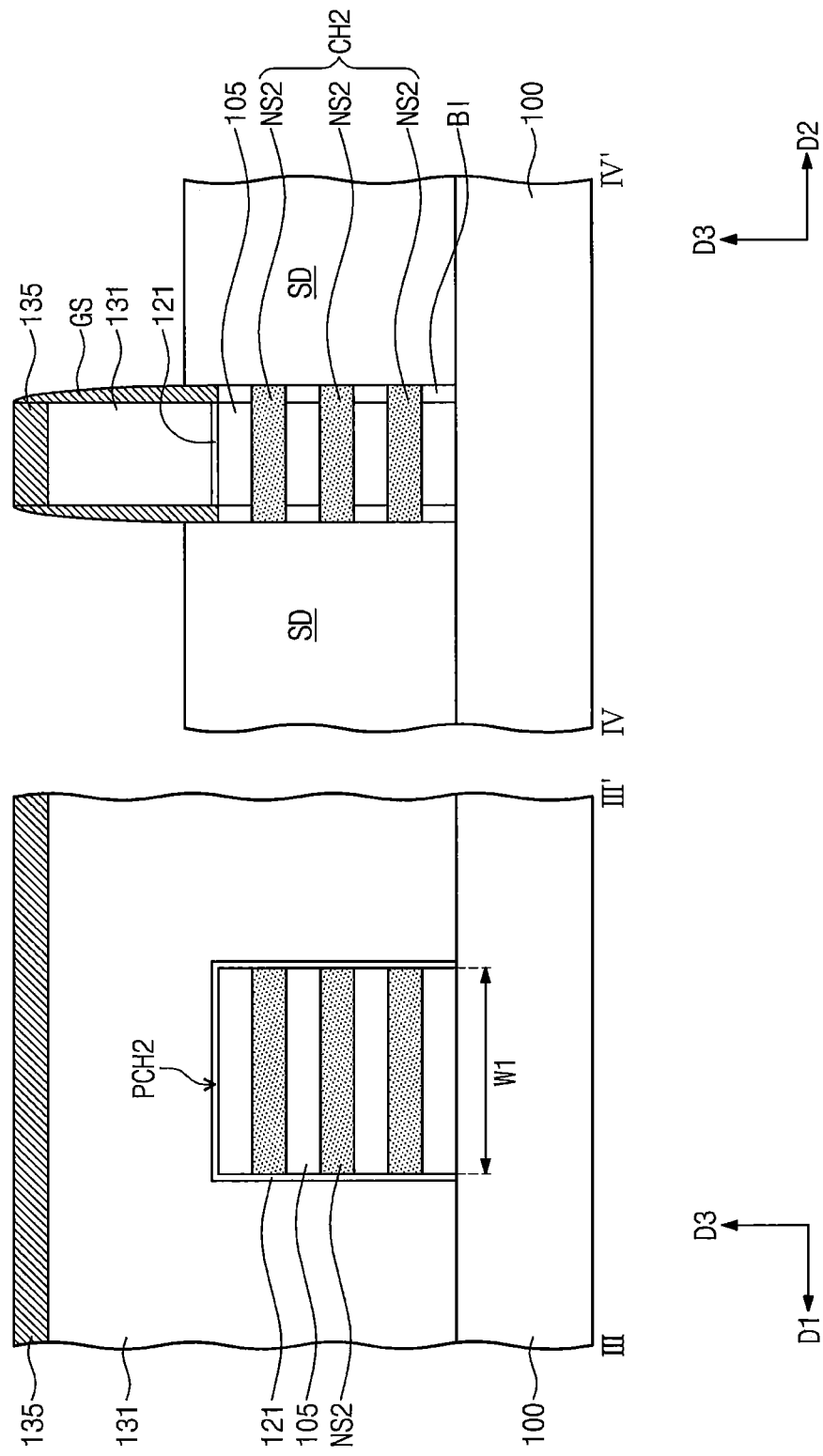
Figure 8A:
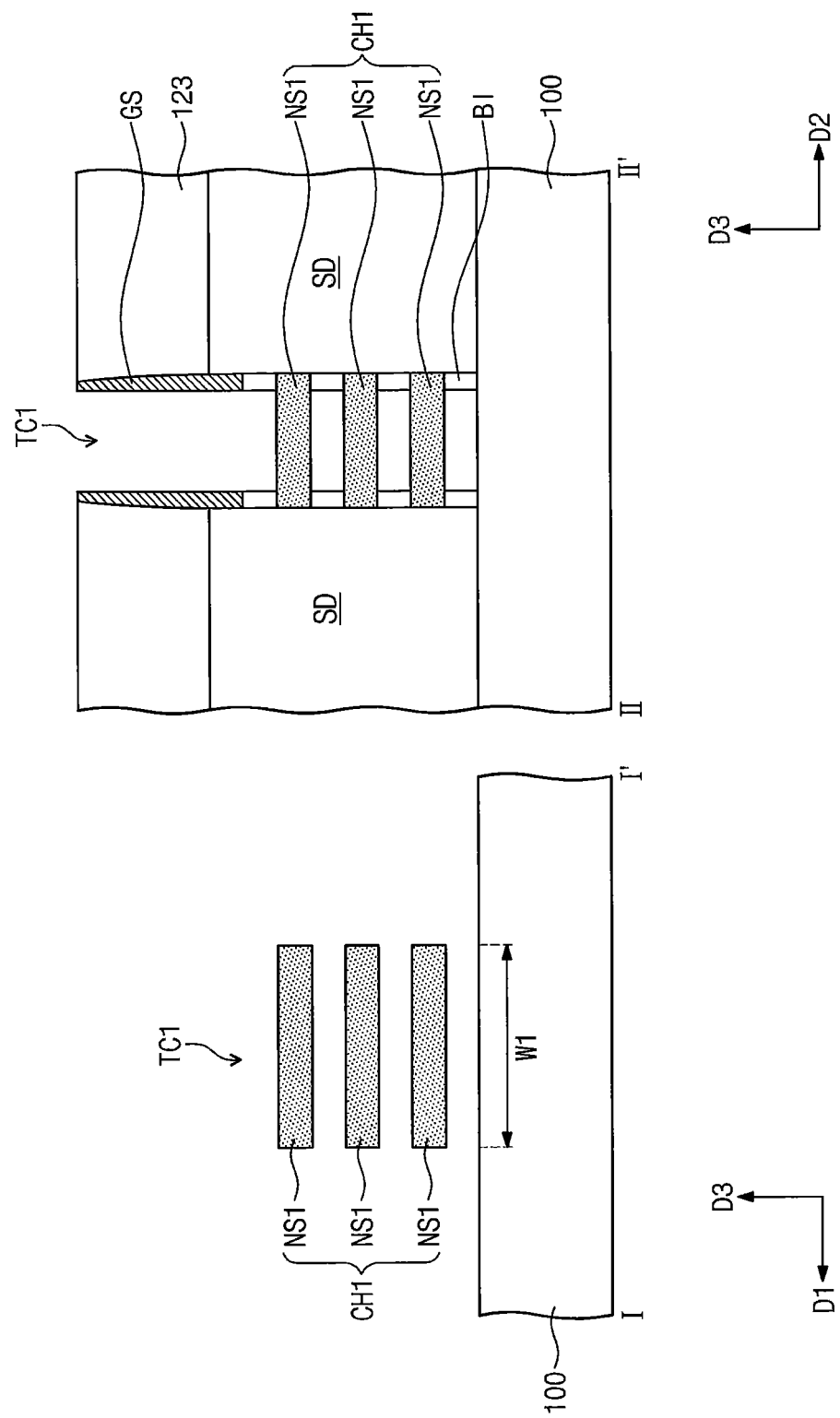
Figure 8B:
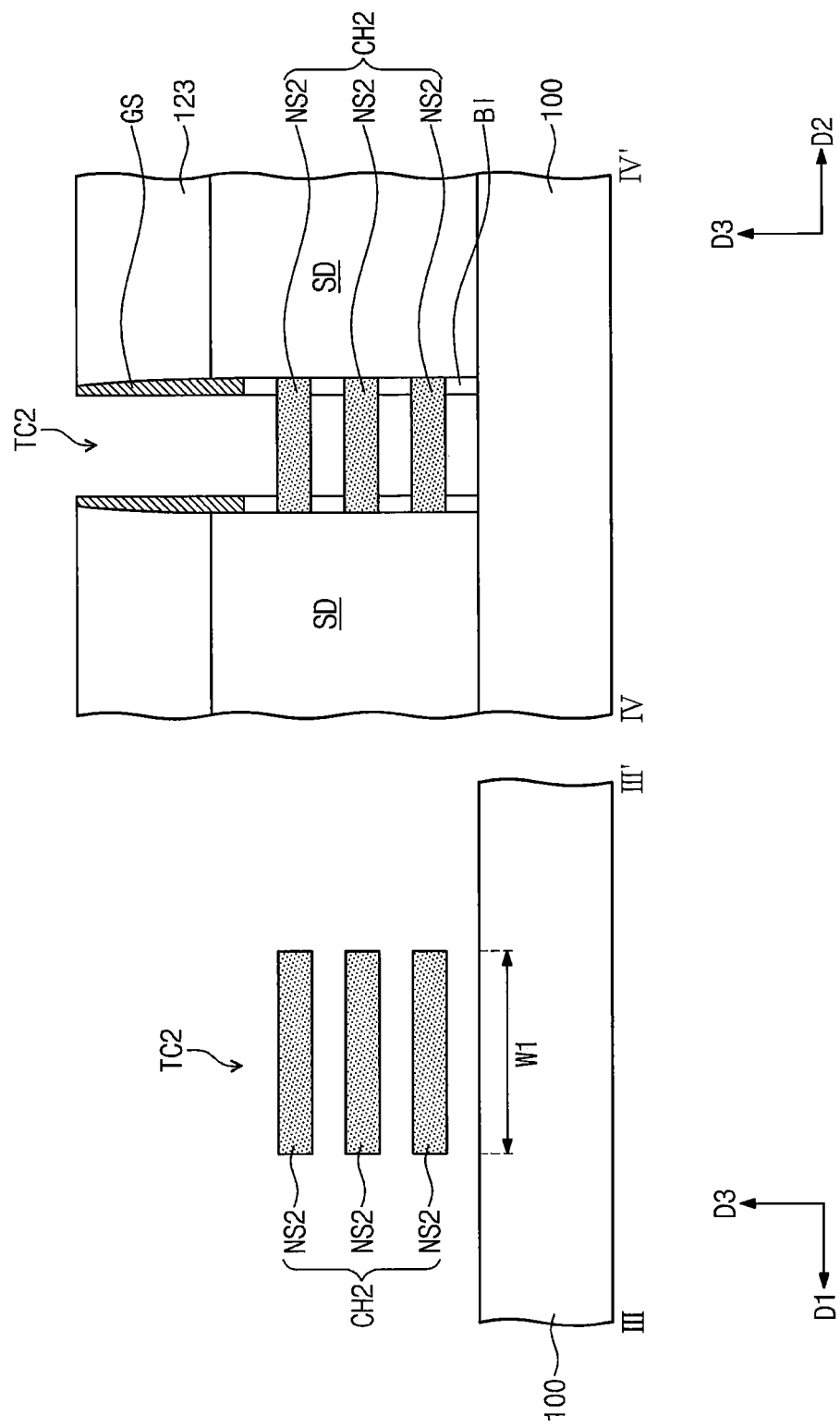
Figure 8C:
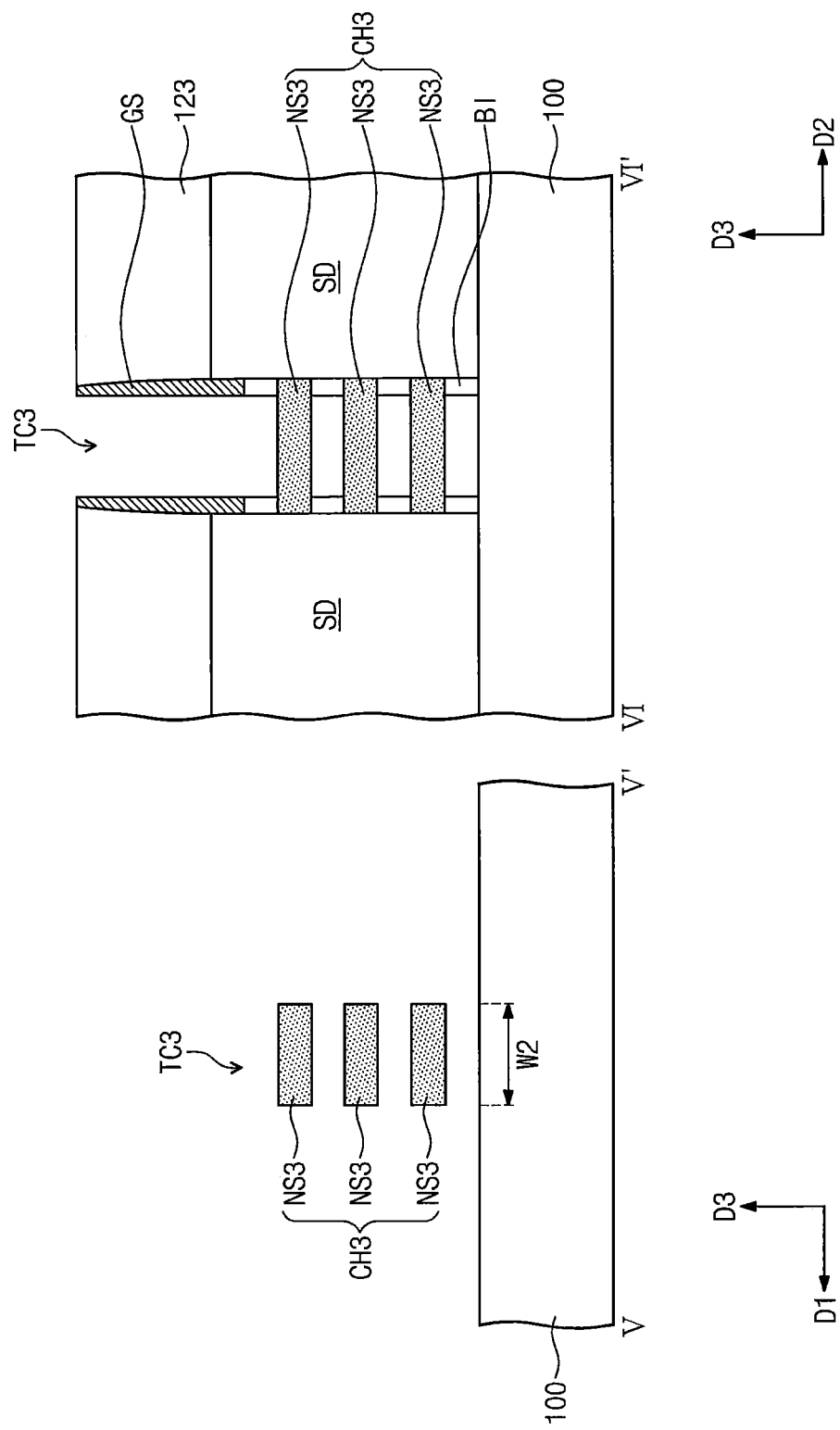

Referring to FIGS. 2 and 8A to 8C, the interlayer insulating layer 123 may be formed and may be planarized to expose top surfaces of the dummy gates 131 (e.g., of FIGS. 7A to 7C). The planarization process of the interlayer insulating layer 123 may include at least one of an etch-back process or a chemical mechanical polishing (CMP) process. The gate mask patterns 135 may be removed during the planarization process of the interlayer insulating layer 123. In some embodiments, the interlayer insulating layer 123 may be formed of or include a silicon oxide layer or a silicon oxynitride layer.

The dummy gates 131 exposed by the planarization process may be selectively removed. The capping insulating layers 121 (e.g., of FIGS. 7A to 7C) may be removed by the process of removing the dummy gates 131 or by an additional removal process. The top surfaces of the first to third preliminary channel regions PCH1 to PCH3 may be exposed, as a result of the removal of the dummy gates 131.

The sacrificial patterns 105 (e.g., of FIGS. 7A to 7C) may be selectively removed from the first to third preliminary channel regions PCH1 to PCH3. For example, in the case where the sacrificial patterns 105 include silicon germanium (SiGe) and the first to third sheets NS1 to NS3 include silicon (Si), the selective removal process may be performed using an etching solution containing peracetic acid. The etching solution may further contain hydrofluoric acid (HF) and deionized water. The barrier insulating pattern BI may protect the source/drain regions SD against the etching solution for removing the sacrificial patterns 105.

The dummy gates 131 and the sacrificial patterns 105 may be removed to form first, second, and third trenches TC1, TC2, and TC3. The first trench TC1 may be empty regions defined by the first sheets NS1, the gate spacer GS, the barrier insulating pattern BI, and the substrate 100. The second trench TC2 may be empty regions defined by the second sheets NS2, the gate spacer GS, the barrier insulating pattern BI, and the substrate 100. Similarly, the third trench TC3 may be empty regions defined by the third sheets NS3, the gate spacer GS, the barrier insulating pattern BI, and the substrate 100. In other words, the first trench TC1 may include empty regions that are formed between the substrate 100 and one of the first sheets NS1 most adjacent to the substrate 100 and between the others of the first sheets NS1. The second trench TC2 may include empty regions that are formed between the substrate 100 and one of the second sheets NS2 most adjacent to the substrate 100 and between the others of the second sheets NS2. Similarly, the third trench TC3 may include empty regions that are formed between the substrate 100 and one of the third sheets NS3 most adjacent to the substrate 100 and between the others of the third sheets NS3.

Thereafter, as shown in FIGS. 3A to 3C, a gate insulating layer and a gate electrode may be formed in each of the first to third trenches TC1 to TC3. For example, the first gate insulating pattern GI1 and the first gate electrode GE1 may be formed in the first trench TC1, the second gate insulating pattern GI2 and the second gate electrode GE2 may be formed in the second trench TC2, and the third gate insulating pattern GI3 and the third gate electrode GE3 may be formed in the third trench TC3. If the formation of the gate insulating layer and the gate conductive layer is finished, a planarization process may be performed to form the gate insulating pattern and the gate electrode in each of the first to third trenches TC1 to TC3. In some embodiments, the gate insulating layer may be formed of or include at least one of a silicon oxide layer, a silicon oxynitride layer, or high-k dielectric layers, whose dielectric constants are higher than that of the silicon oxide layer. For example, the gate conductive layer may be formed of or include at least one of doped semiconductor, conductive metal nitrides, or metals. The first gate electrode GE1 may be formed to enclose or surround an exposed portion of the first sheets NS1, the second gate electrode GE2 may be formed to enclose or surround an exposed portion of the second sheets NS2, and the third gate electrode GE3 may be formed to enclose or surround an exposed portion of the third sheets NS3.

Upper portions of the gate insulating patterns GI1 to GI3 and the first to third gate electrodes GE1 to GE3 may be partially recessed and the capping patterns GP may be formed in the recesses regions, respectively. In some embodiments, the capping patterns GP may be formed of or include at least one of a silicon oxide layer, a silicon nitride layer, or a silicon oxynitride layer.

Figure 9:
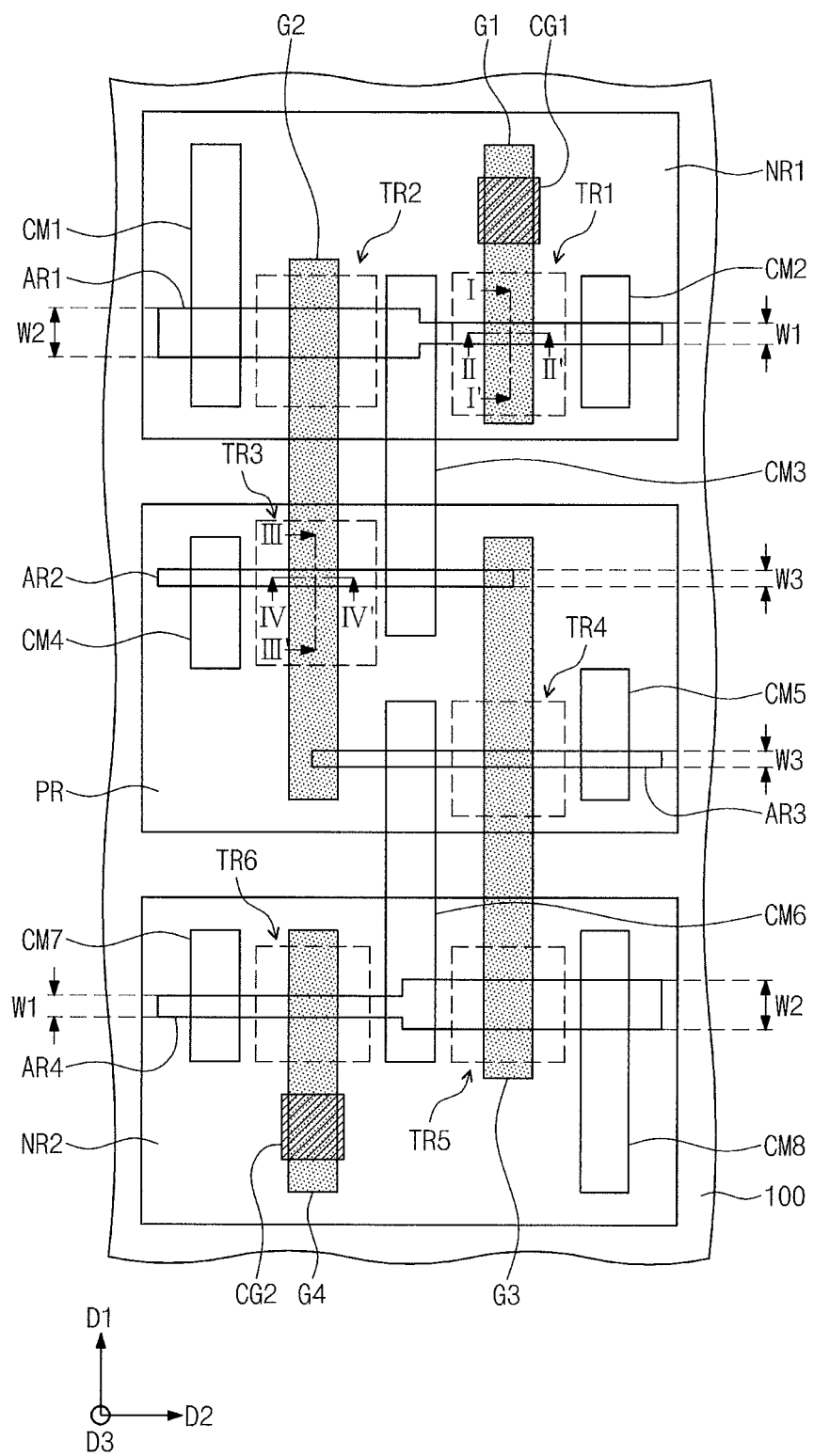
FIG. 9 is a plan view illustrating another example of the SRAM cell of FIG. 1.
Figure 10A:
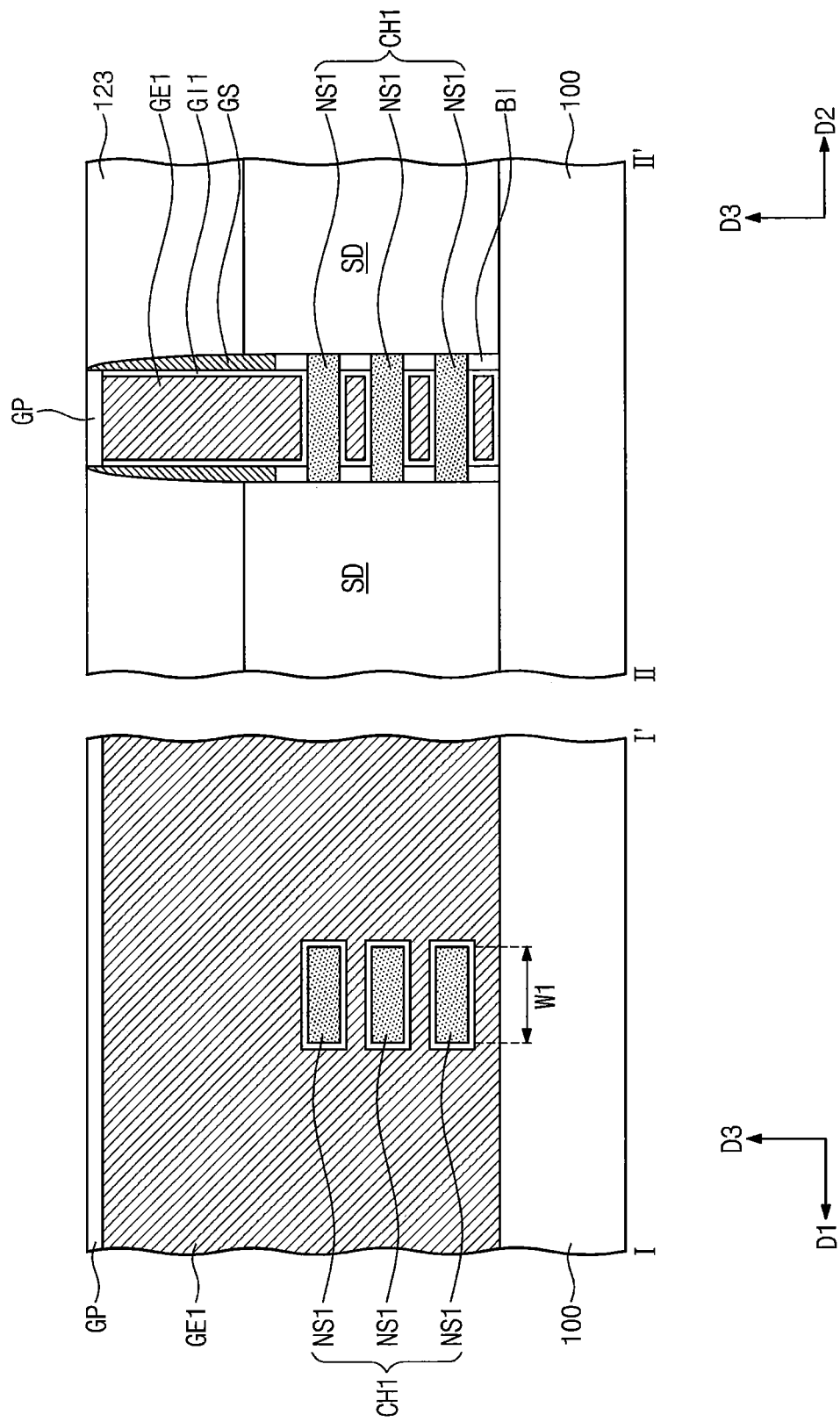
FIG. 10A is a sectional view taken along lines I-I' and II-II' of FIG. 9.
Figure 10C:
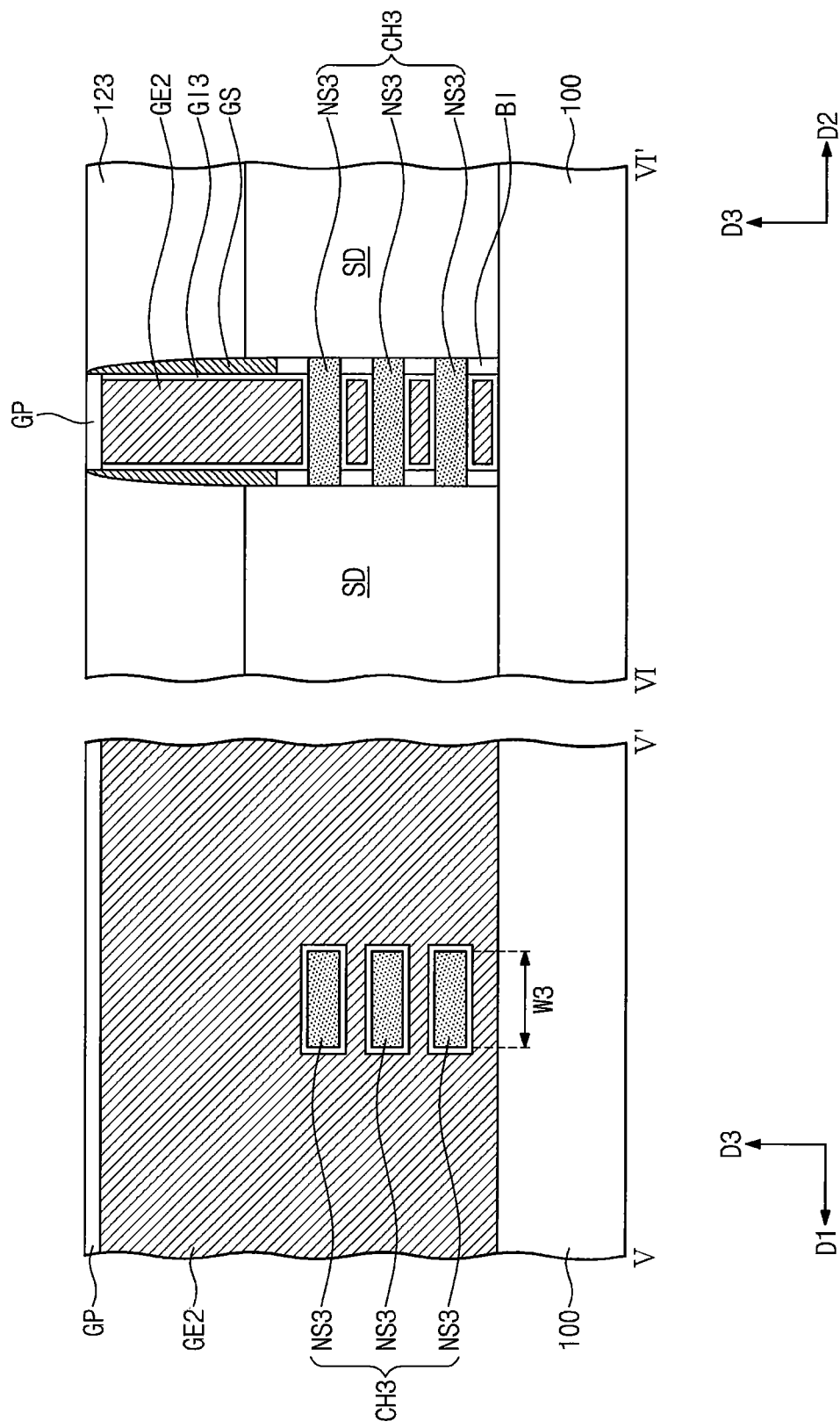
FIG. 10C is a sectional view taken along lines V-V' and VI-VI' of FIG. 9.
Figure 11B:
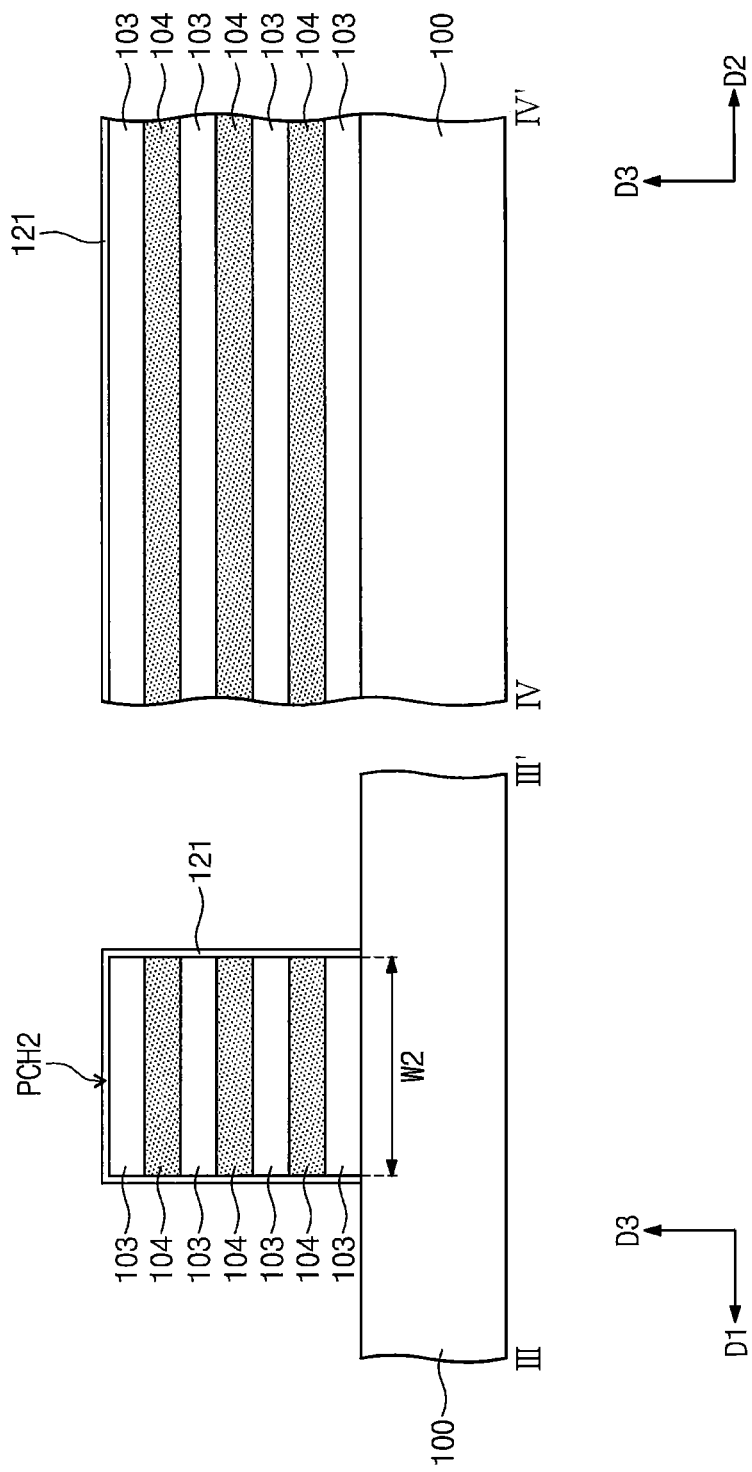

FIG. 9 is a plan view illustrating another example of the SRAM cell of FIG. 1. FIG. 10A is a sectional view taken along lines I-I' and II-IP of FIG. 9. FIG. 10B is a sectional view taken along lines III-III' and IV-IV' of FIG. 9. FIG. 10C is a sectional view taken along lines V-V' and VI-VI' of FIG. 9.

Referring to FIGS. 9 and 10A to 10C, the first, second, third, fourth, fifth, and sixth transistors TR1, TR2, TR3, TR4, TR5, to TR6 may be provided on the substrate 100. The first, second, fifth, and sixth transistors TR1, TR2, TR5, and TR6 may be NMOS transistors, and the third and fourth transistors TR3 and TR4 may be PMOS transistors. Similar to the above embodiments described with reference to FIG. 2, owing to the structural features of the SRAM cell, the first transistor TR1 may have substantially the same structure as the sixth transistor TR6, the second transistor TR2 may have substantially the same structure as the fifth transistor TR5, and the third transistor TR3 may have substantially the same structure as the fourth transistor TR4. Thus, for a concise description, a detailed description of the fourth to sixth transistors TR4 to TR6 will be omitted.

Each of the first to third transistors TR1 to TR3 may include a gate structure extending in the first direction D1, a pair of the source/drain regions SD formed at both sides of the gate structure, and the channel region CH1, CH2, or CH3 connecting the source/drain regions SD to each other.

Each of the first to third channel regions CH1 to CH3 may include a plurality of sheets, which are vertically separated from each other and are stacked on the substrate 100. For example, the first channel region CH1 may include the first sheets NS1, the second channel region CH2 may include the second sheets NS2, and the third channel region CH3 may include the third sheets NS3. The first sheets NS1 may be vertically separated from each other, and the lowermost one of the first sheets NS1 may be vertically separated from the substrate 100. This may be true for the second and third sheets NS2 and NS3. The first to third sheets NS1 to NS3 may be formed of the same material. For example, the first to third sheets NS1 to NS3 may be formed of or include at least one of Si, SiGe, or Ge.

The source/drain regions SD of the first transistor TR1 may be electrically connected to each other through the first sheets NS1. The source/drain regions SD of the first transistor TR1 may be epitaxial patterns, which may be epitaxially grown using the substrate 100 as a seed layer. The source/drain regions SD of the second transistor TR2 may be electrically connected to each other through the second sheets NS2. The source/drain regions SD of the second transistor TR2 may be epitaxial patterns, which may be epitaxially grown using the substrate 100 as a seed layer. The source/drain regions SD of the third transistor TR3 may be electrically connected to each other through the third sheets NS3. The source/drain regions SD of the third transistor TR3 may be epitaxial patterns, which may be epitaxially grown using the substrate 100 as a seed layer.

The first to third transistors TR1 to TR3 may be provided to have different channel widths. For example, the first active region AR1 may be shared by or included in the first and second transistors TR1 and TR2. There may be a difference in width between two portions of the first active region AR1, which are respectively included in the first and second transistors TR1 and TR2. For example, when measured in the first direction D1, the first transistor TR1 may have a first width W1 and the second transistor TR2 may have a second width W2 that is different from the first width W1. In some embodiments, the first width W1 may be smaller than the second width W2. For example, the second width W2 may be about 1.4 to about 10 times the first width W1, but the inventive concepts are not limited thereto. A portion of the second active region AR2 may be used as a part of the third transistor TR3, and the second active region AR2 may have a third width W3 in the first direction D1. The third width W3 may be smaller than or the same as the first width W1.

According to some embodiments of the inventive concepts, a plurality of sheets may be used as a channel region of each transistor of the SRAM cell. However, a width of the channel region or the sheets of the SRAM cell may be determined based on a type of the transistor; for example, the pass gate transistor, the pull-up transistor, or the pull-down transistor of the SRAM cell may have different channel widths. This may make it possible to improve performance of the SRAM cell and to reduce an occupying area of the SRAM cell.

FIGS. 11A to 14A are sectional views taken along lines I-I' and II-II' of FIG. 9. FIGS. 11B to 14B are sectional views taken along lines III-III' and IV-IV' of FIG. 9. FIGS. 11C to 14C are sectional views taken along lines V-V' and VI-VP of FIG. 9. Hereinafter, a method of fabricating a SRAM cell, according to some embodiments of the inventive concepts, will be described with reference to FIGS. 11A to 14C.

Referring to FIGS. 9 and 11A to 11C, a plurality of sacrificial layers and a plurality of first semiconductor layers may be alternatingly and repeatedly formed on the substrate 100, and then, a patterning process may be performed on the resulting structure. As a result of the patterning process, the first to third preliminary channel regions PCH1 to PCH3 may be formed on the substrate 100. Each of the first to third preliminary channel regions PCH1 to PCH3 may include a plurality of the preliminary sacrificial patterns 103 and a plurality of the first semiconductor patterns 104. Although each of the first to third preliminary channel regions PCH1 to PCH3 is illustrated to have three first semiconductor patterns 104, the inventive concepts are not limited thereto.

When the patterning process is finished, the capping insulating layers 121 may be formed on the first to third preliminary channel regions PCH1 to PCH3.

Referring to FIGS. 9 and 12A to 12C, the dummy gates 131 may be formed. The dummy gates 131 may be a line- or bar-shaped structure extending in the first direction D1. The gate mask patterns 135 may be formed on the dummy gates 131. The formation of the dummy gates 131 and the gate mask patterns 135 may include sequentially forming a dummy gate layer and a gate mask layer on the substrate 100 and patterning the dummy gate layer and the gate mask layer. The gate spacers GS may be formed on side surfaces of the dummy gates 131. The gate spacers GS may be formed of or include at least one of a silicon oxide layer, a silicon nitride layer, or a silicon oxynitride layer.

Figure 12A:
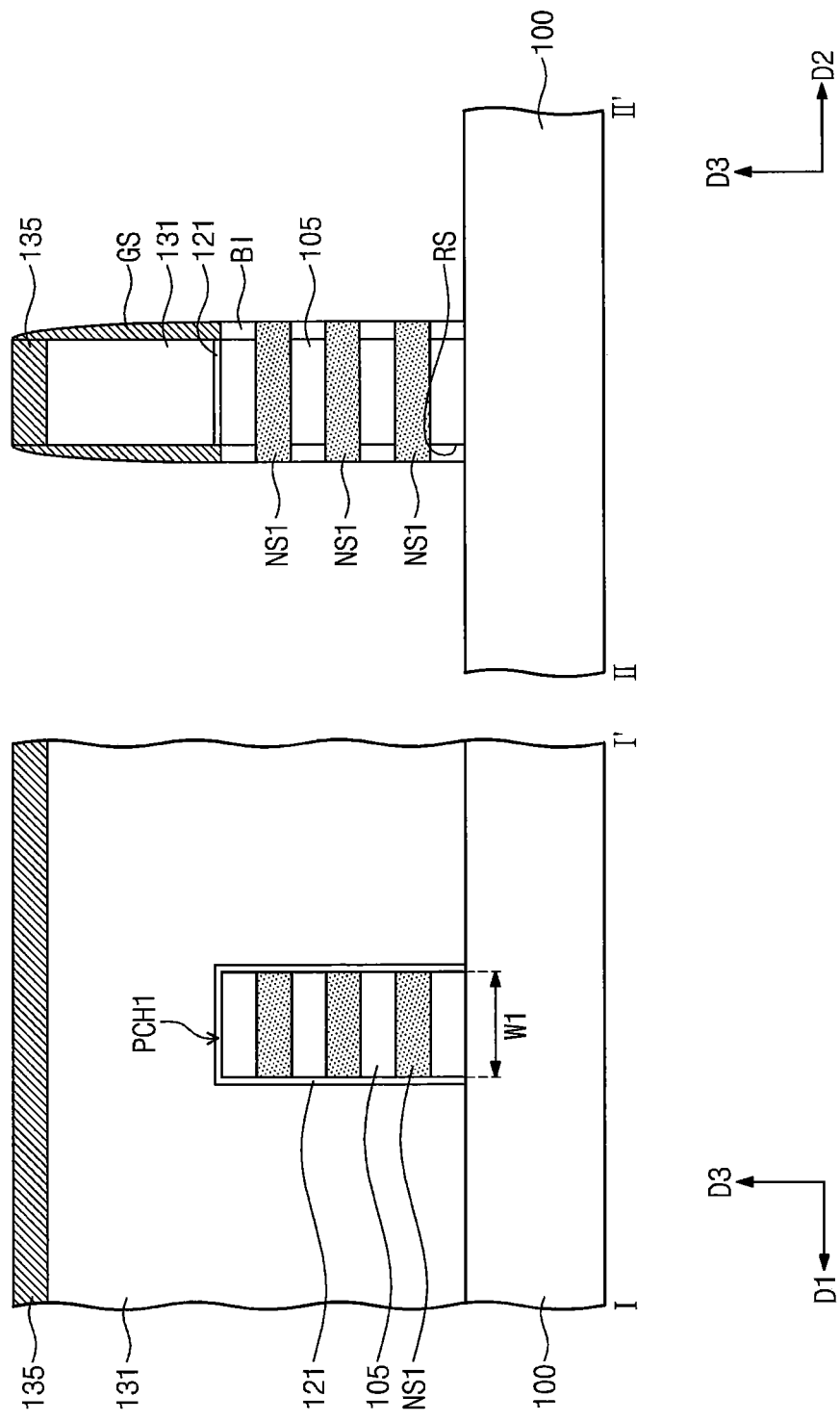
Figure 12B:
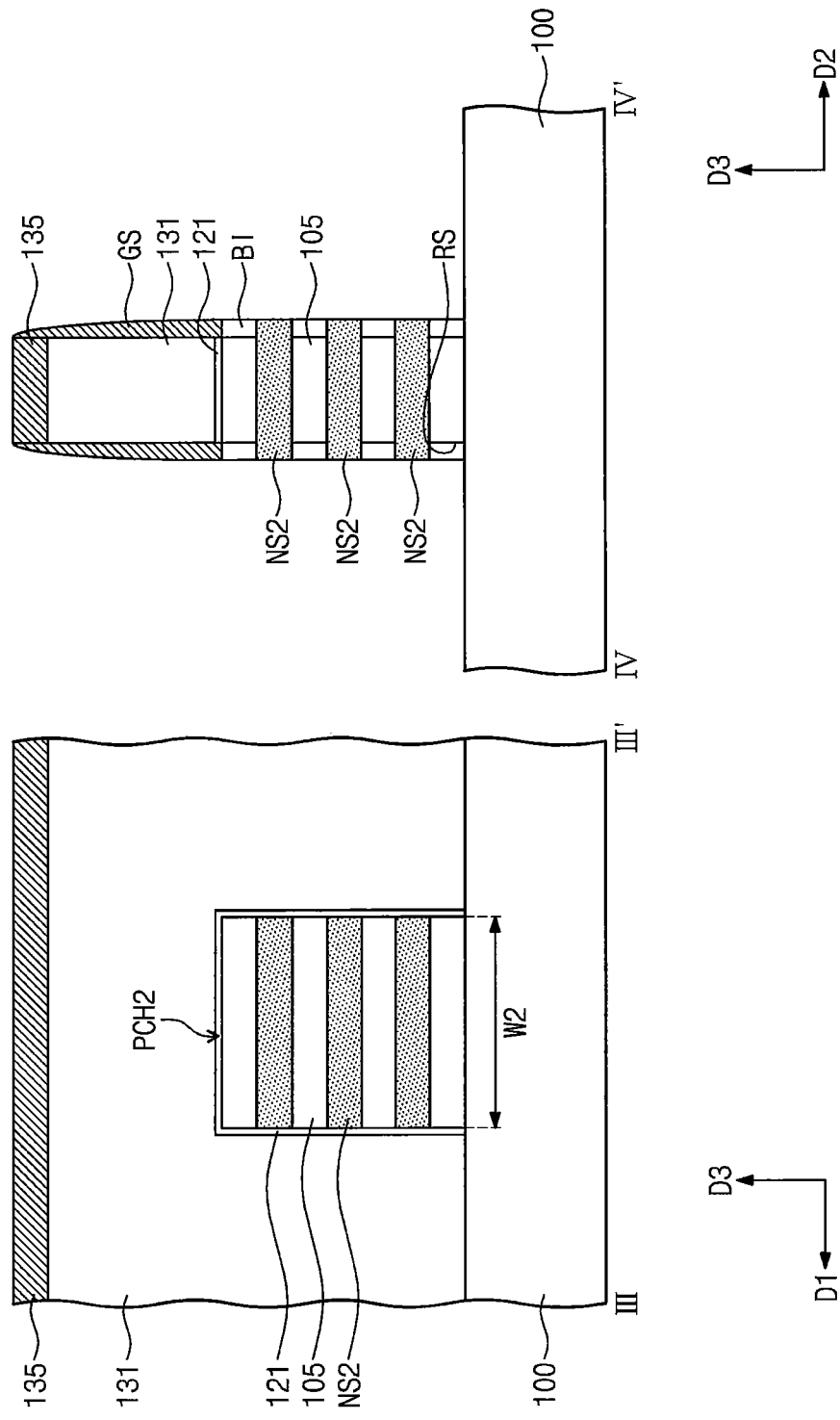
Figure 12C:
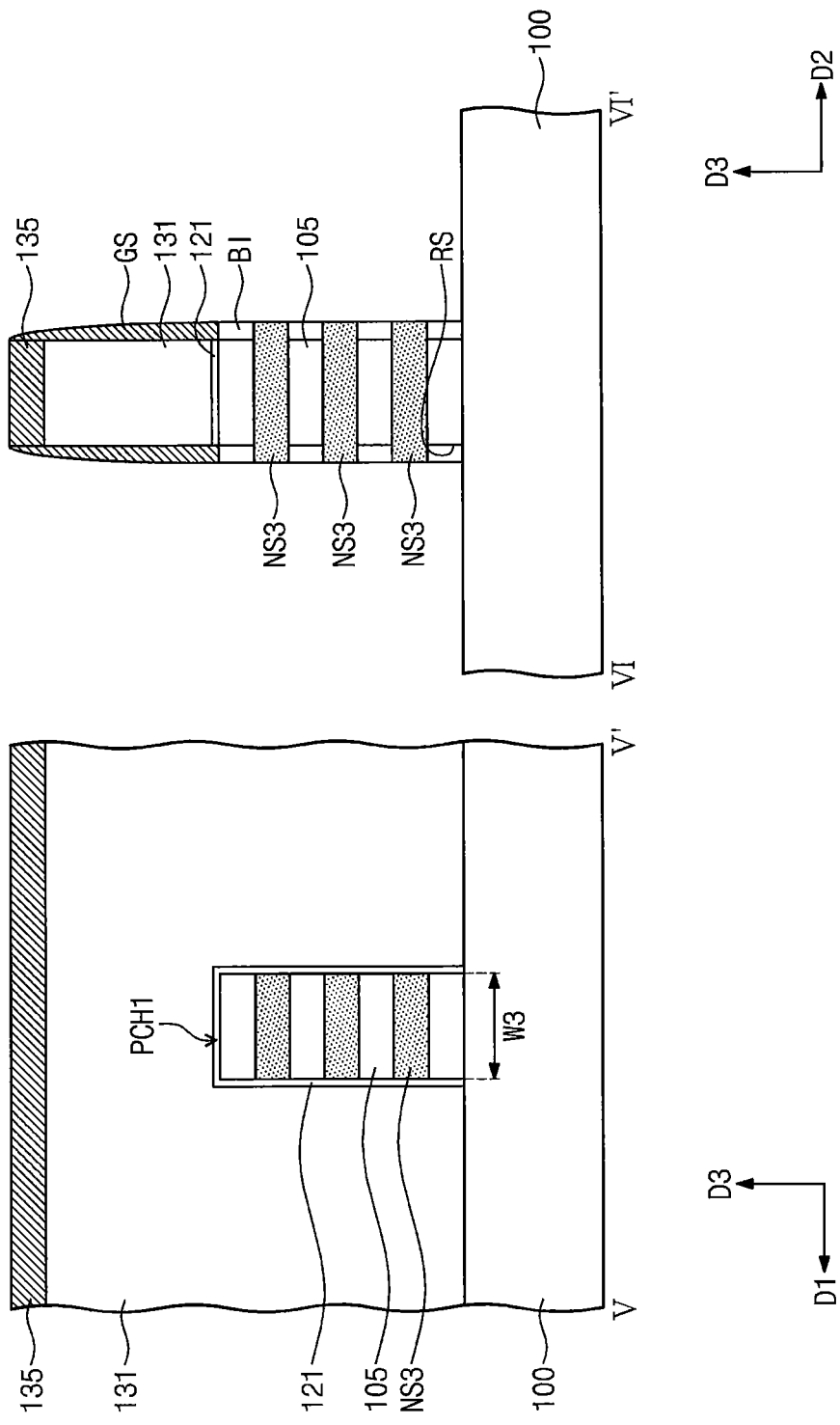

The first to third preliminary channel regions PCH1 to PCH3 may be etched using the gate mask patterns 135 and the gate spacers GS as an etch mask to form the first to third channel regions CH1 to CH3. When measured in the first direction D1, as shown in FIGS. 12A to 12C, the first sheets NS1 may be formed to have a first width W1, the second sheets NS2 may be formed to have a second width W2, and the third sheets NS3 may be formed to have a third width W3. In some embodiments, the first width W1 may be smaller than the second width W2. For example, the second width W2 may be about 1.4 to about 10 times the first width W1. The third width W3 may be substantially equal to or smaller than the second width W2.

The recess regions RS may be formed by laterally etching the sacrificial patterns 105. The recess regions RS may be formed using an etchant capable of selectively etching the sacrificial patterns 105. The barrier insulating patterns BI may be formed in the recess regions RS, respectively.

Referring to FIGS. 9 and 13A to 13C, the source/drain regions SD may be formed at both sides of each of the dummy gates 131. The source/drain regions SD may be formed by a selective epitaxial process using the substrate 100 as a seed layer. For example, the source/drain regions SD of the first transistor TR1 may be formed of or include a material capable of exerting a tensile strain to the first channel region CH1, and the source/drain regions SD of the second transistor TR2 may be formed of or include a material capable of exerting a tensile strain to the second channel region CH2. For example, the source/drain regions SD of the first and second transistors TR1 and TR2 may include a SiC layer, whose lattice constant is smaller than that of silicon, or a Si layer, whose lattice constant is the same as that of the substrate 100. By contrast, the source/drain regions SD of the third transistor TR3 may be formed of or include a material capable of exerting a compressive strain to the third channel region CH3. For example, the source/drain regions SD of the third transistor TR3 may include a SiGe layer, whose lattice constant is larger than that of silicon.

Figure 13A:
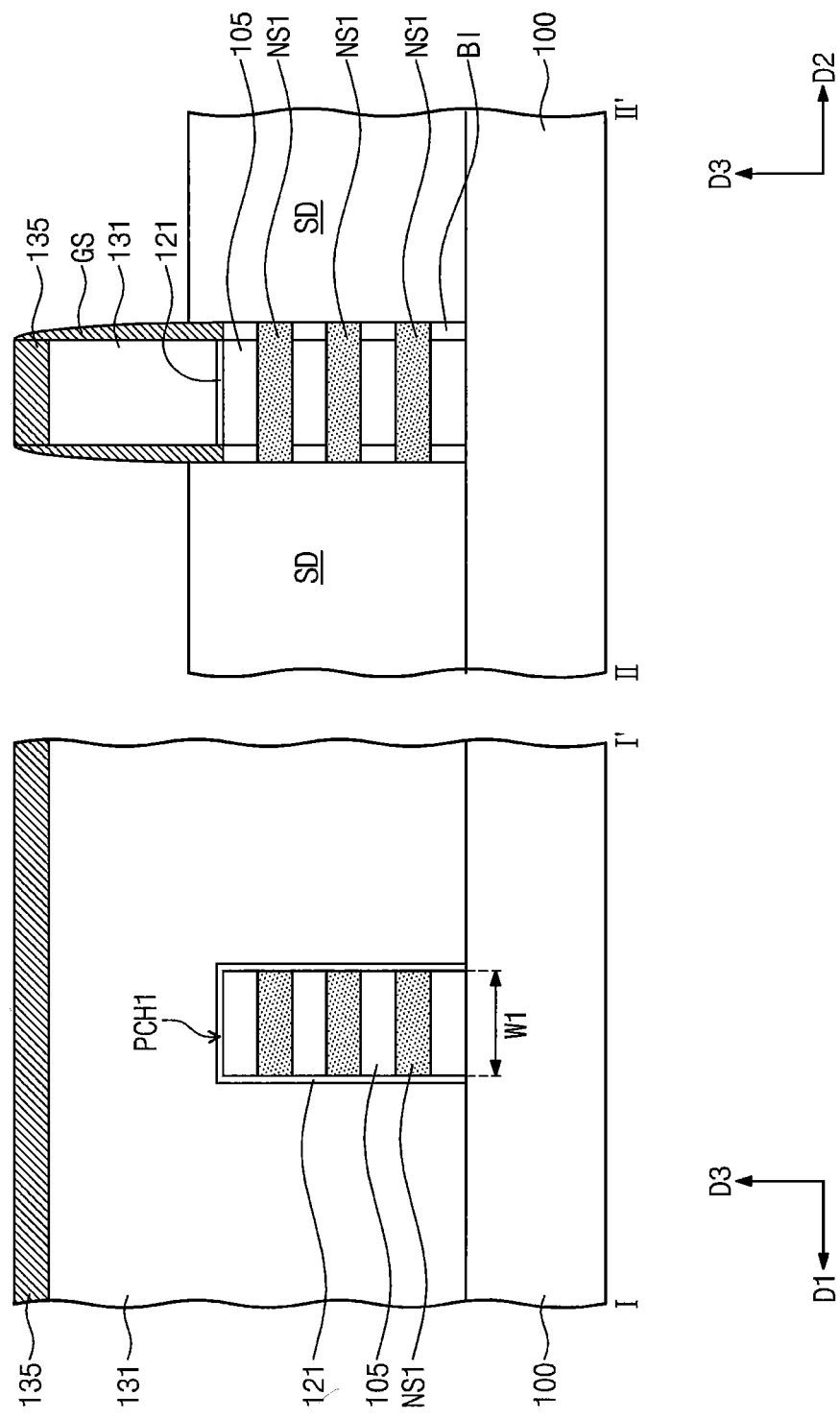
Figure 13B:
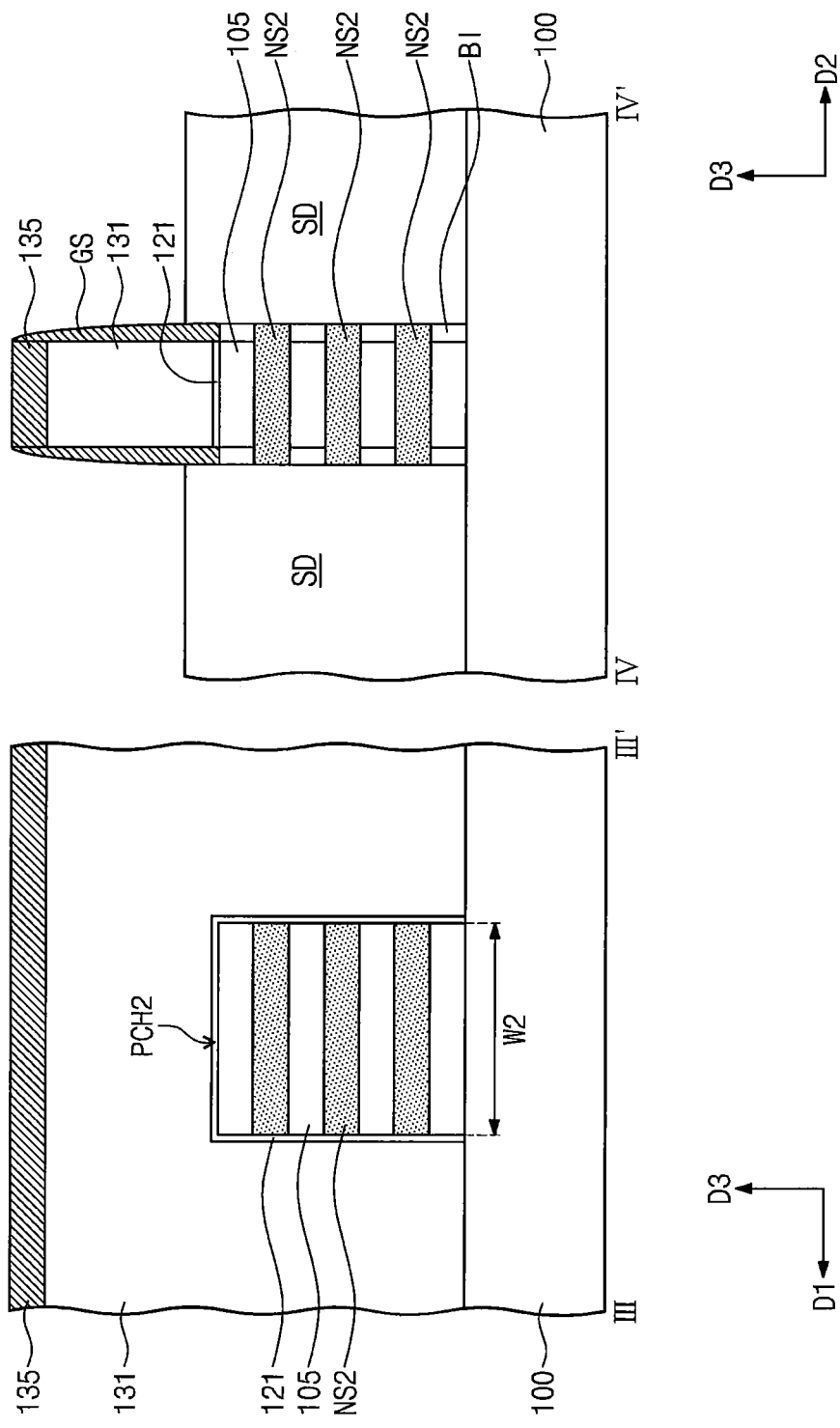
Figure 13C:
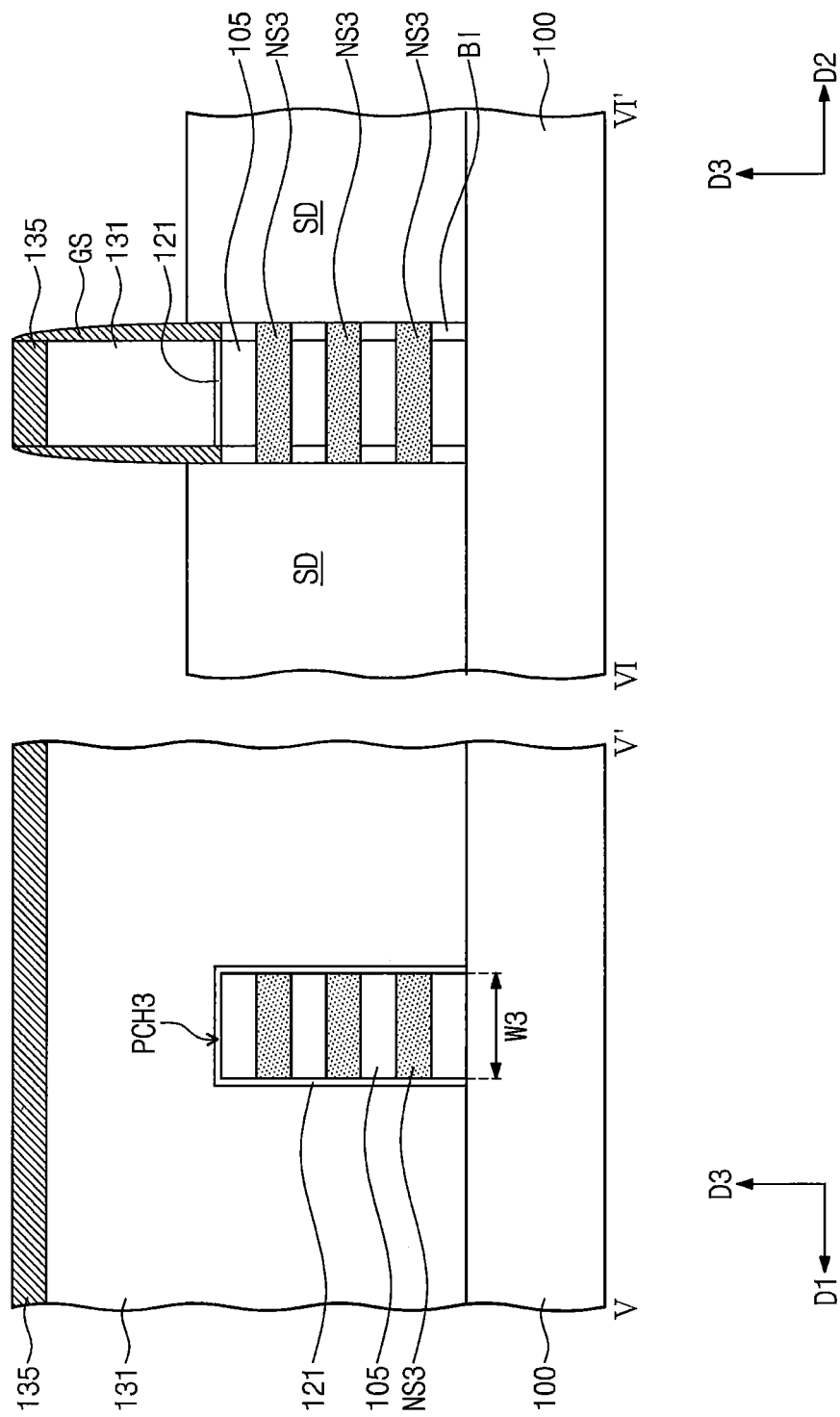
Figure 14A:
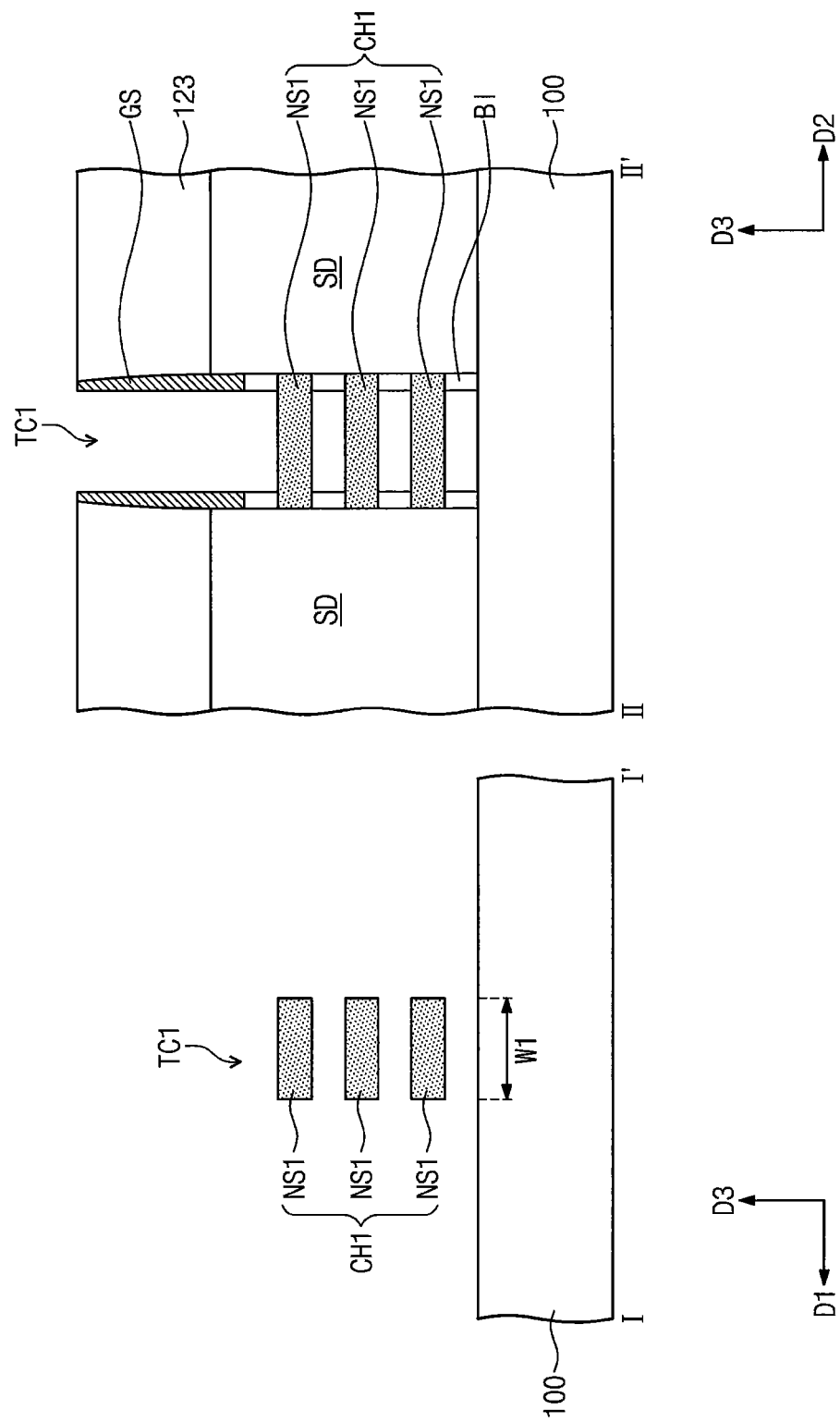
Figure 14B:
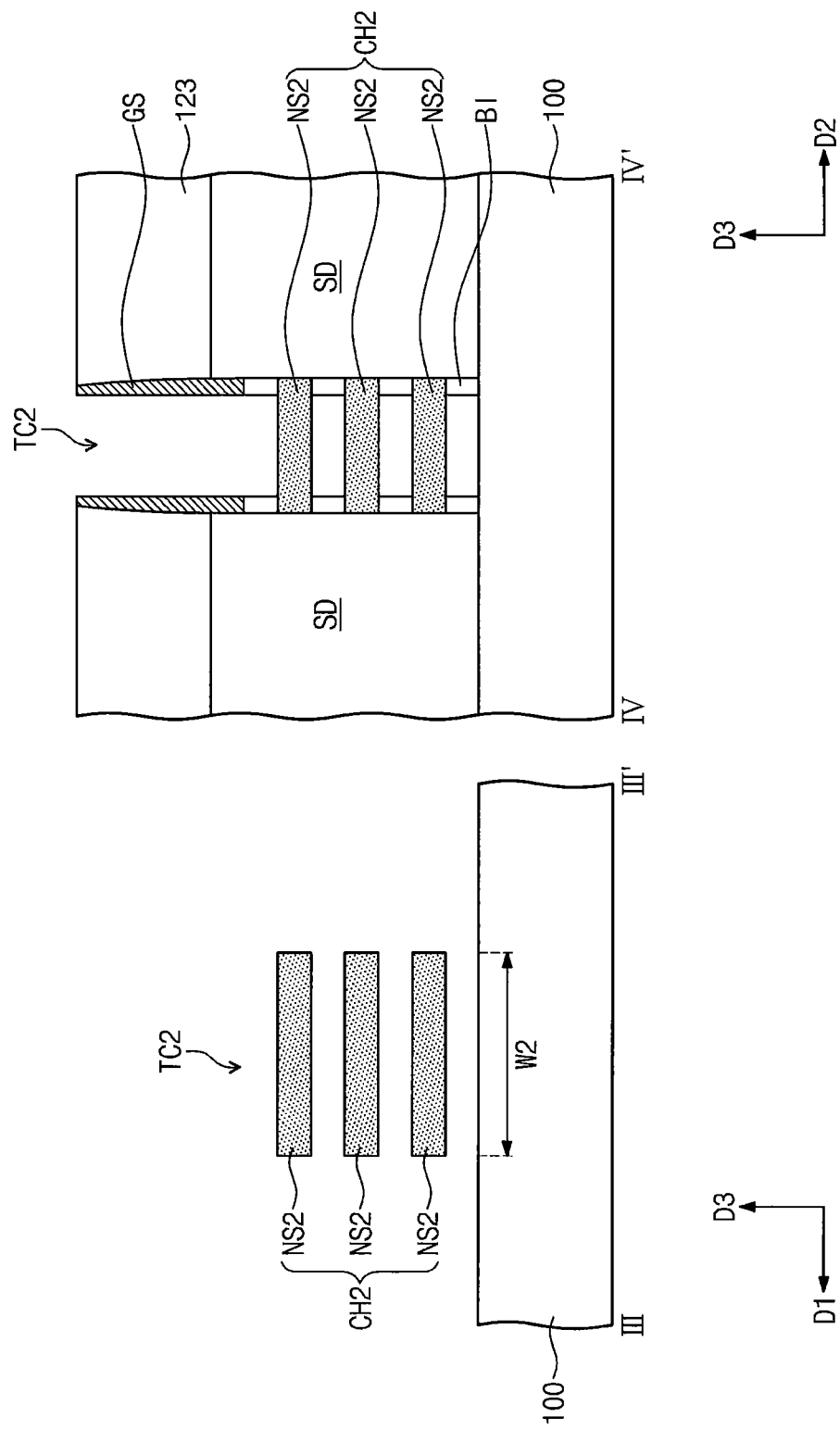
Figure 14C:
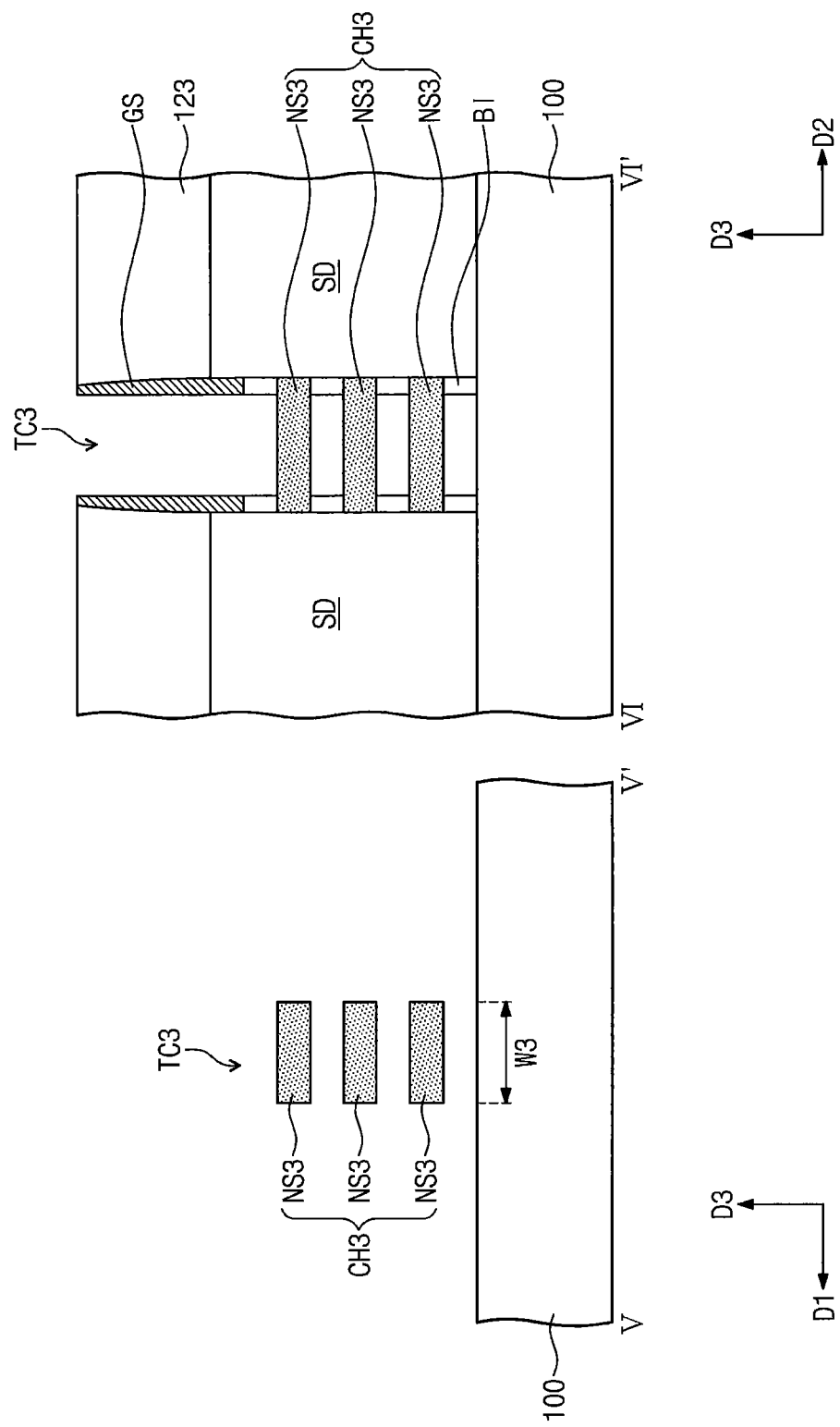

Referring to FIGS. 9 and 14A to 14C, the interlayer insulating layer 123 may be formed on the substrate 100 and may be planarized to expose top surfaces of the dummy gates 131 (e.g., of FIGS. 13A to 13C). The planarization process may include an etch-back process or a chemical mechanical polishing (CMP) process. The gate mask patterns 135 may be removed during the planarization process of the interlayer insulating layer 123. For example, the interlayer insulating layer 123 may be formed of or include a silicon oxide layer or a silicon oxynitride layer.

The dummy gates 131 exposed by the planarization process may be selectively removed. The capping insulating layers 121 (e.g., of FIGS. 13A to 13C) may be removed by the process of removing the dummy gates 131 or by an additional removal process. The top surfaces of the first to third preliminary channel regions PCH1 to PCH3 (e.g., of FIGS. 13A to 13C) may be exposed, as a result of the removal of the dummy gates 131.

The sacrificial patterns 105 (e.g., of FIGS. 13A to 13C) may be selectively removed from the first to third preliminary channel regions PCH1 to PCH3. For example, in the case where the sacrificial patterns 105 include silicon germanium (SiGe) and the first to third sheets NS1 to NS3 include silicon (Si), the selective removal process may be performed using an etching solution containing peracetic acid. The etching solution may further contain hydrofluoric acid (HF) and deionized water. The barrier insulating pattern BI may protect the source/drain regions SD against the etching solution for removing the sacrificial patterns 105.

The dummy gates 131 and the sacrificial patterns 105 may be removed to form the first, second, and third trenches TC1, TC2, and TC3. The first trench TC1 may be empty regions defined by the first sheets NS1, the gate spacer GS, the barrier insulating pattern BI, and the substrate 100. The second trench TC2 may be empty regions defined by the second sheets NS2, the gate spacer GS, the barrier insulating pattern BI, and the substrate 100. Similarly, the third trench TC3 may be empty regions defined by the third sheets NS3, the gate spacer GS, the barrier insulating pattern BI, and the substrate 100. In other words, the first trench TC1 may include empty regions that are formed between the substrate 100 and one of the first sheets NS1 most adjacent to the substrate 100 and between the others of the first sheets NS1. The second trench TC2 may include empty regions that are formed between the substrate 100 and one of the second sheets NS2 most adjacent to the substrate 100 and between the others of the second sheets NS2. Similarly, the third trench TC3 may include empty regions that are formed between the substrate 100 and one of the third sheets NS3 most adjacent to the substrate 100 and between the others of the third sheets NS3.

Thereafter, as shown in FIGS. 10A to 10C, a gate insulating layer and a gate electrode may be formed in each of the first to third trenches TC1 to TC3. For example, the first gate insulating pattern GI1 and the first gate electrode GE1 may be formed in the first trench TC1, the second gate insulating pattern GI2 and the second gate electrode GE2 may be formed in the second trench TC2, and the third gate insulating pattern GI3 and the third gate electrode GE3 may be formed in the third trench TC3. If the formation of the gate insulating layer and the gate conductive layer is finished, a planarization process may be performed to form the gate insulating pattern and the gate electrode in each of the first to third trenches TC1 to TC3. The first gate electrode GE1 may be formed to enclose or surround an exposed portion of the first sheets NS1, the second gate electrode GE2 may be formed to enclose or surround an exposed portion of the second sheets NS2, and the third gate electrode GE3 may be formed to enclose or surround an exposed portion of the third sheets NS3.

Upper portions of the gate insulating patterns GI1 to GI3 and the first to third gate electrodes GE1 to GE3 may be partially recessed and the capping patterns GP may be formed in the recesses regions, respectively.

Up to now, several methods of fabricating an SRAM cell have been described. However, the inventive concepts may not be limited thereto, and various other methods may also be used to form a GAA-type channel region with a plurality of sheets. By using such methods, the sheets or the channel region of the SRAM cell may be formed to have a width varying depending on a type of a transistor. This may make it possible to improve performance of the SRAM cell and to reduce an occupying area of the SRAM cell.

According to some embodiments of the inventive concepts, an SRAM device may include a plurality of sheets, which are used as a channel region of a transistor, and whose width is determined based on a type of the transistor.

Since the width of the sheets is determined based on a type of each transistor constituting the SRAM device, it is possible to improve performance of the SRAM device and to reduce an occupying area of the SRAM device.

Although detailed embodiments of inventive concepts have been described, it should be understood that numerous other modifications, changes, variations, and substitutions can be devised by those skilled in the art. Moreover, it should be understood that the inventive concepts cover various techniques which can be readily modified and embodied based on the above-described embodiments.

What is claimed is:

1. An SRAM device, comprising:
   a substrate comprising a first NMOS region, a PMOS region, and a second NMOS region;
   a first transistor on the first NMOS region comprising a first gate structure extending in a first direction, first source/drain regions, and a first plurality of semiconductor sheets spaced apart from each other in a third direction perpendicular to a top surface of the substrate;
   a second transistor on the first NMOS region comprising a second gate structure extending in the first direction, second source/drain regions, and a second plurality of semiconductor sheets spaced apart in the third direction; and
   a third transistor on the PMOS region comprising a third gate structure extending in the first direction, and third source/drain regions a third plurality of semiconductor sheets spaced apart in the third direction,
   wherein the first gate structure comprises first barrier insulating patterns provided between the first plurality of semiconductor sheets and spaced apart in the third direction, the second gate structure comprises at least one second barrier insulating pattern provided between the second plurality of semiconductor sheets and spaced apart in the third direction, and the first barrier insulating patterns and the second barrier insulating patterns are positioned substantially at the same level from the substrate, and
   wherein each of the third plurality of semiconductor sheets spaced apart From the substrate has a second width in the first direction, and each of the first plurality of semiconductor sheets spaced apart from the substrate and each of the second plurality of semiconductor sheets spaced apart from the substrate has a first width greater than the second width in the first direction,
   wherein the first width is about 1.4 to about 10 times the second width.

2. The SRAM device of claim 1, wherein the first plurality of semiconductor sheets, the second plurality of semiconductor sheets, and the third plurality of semiconductor sheets are stacked in a vertical direction on the substrate.

3. The SRAM device of claim 1, wherein three semiconductor sheets, which are respectively selected from the first, second, and third plurality of semiconductor sheets and that are positioned at the same level, have substantially the same thickness.

4. The SRAM device of claim 3, wherein the first plurality of semiconductor sheets have substantially the same thickness, the second plurality of semiconductor sheets have substantially the same thickness, and
   the third plurality of semiconductor sheets have substantially the same thickness.

5. The SRAM device of claim 1, wherein a length of the second plurality of semiconductor sheets in a second direction, perpendicular to the first direction, is substantially equal to a length of the third plurality of semiconductor sheets in the second direction.

6. The SRAM device of claim 1, wherein the first and second transistors are NMOS transistors, and the third transistor is a PMOS transistor.

7. The SRAM device of claim 1, further comprising:
   a fourth transistor comprising a fourth gate structure extending in the first direction in the PMOS region, fourth source/drain regions in the PMOS region on opposite sides of the fourth gate structure, and a fourth plurality of semiconductor sheets connecting the fourth source/drain regions to each other;
   a fifth transistor comprising a fifth gate structure extending in the first direction in the second NMOS region, fifth source/drain regions in the second NMOS region on opposite sides of the fifth gate structure, and a fifth plurality of semiconductor sheets connecting the fifth source/drain regions to each other; and
   a sixth transistor comprising a sixth gate structure extending in the first direction in the second NMOS region, sixth source/drain regions in the second NMOS region on opposite sides of the sixth gate structure, and a sixth plurality of semiconductor sheets connecting the sixth source/drain regions to each other,
   wherein the fifth plurality of semiconductor sheets and sixth plurality of semiconductor sheets have a width in the first direction that is the same as the first width of the first plurality of semiconductor sheets and second plurality of semiconductor sheets, and the fourth plurality of semiconductor sheets have a width in the first direction that is the same as the second width of the third plurality of semiconductor sheets,
   and wherein the fifth transistor and the sixth transistor share an active region that comprises the fifth plurality of semiconductor sheets and the sixth plurality of semiconductor sheets.

8. An SRAM device, comprising: a substrate comprising a first NMOS region, a PMOS region, and a second NMOS region; a first transistor on the first NMOS region comprising a first gate structure extending in a first direction, and a first plurality of semiconductor sheets spaced apart from the substrate in a third direction, each of the first plurality of semiconductor sheets has a first width in the first direction greater than a thickness in the third direction; a second transistor on the first NMOS region comprising a second gate structure extending in the first direction, and a second plurality of semiconductor sheets spaced apart from the substrate, each of the second plurality of semiconductor sheets has a second width in the first direction greater than a thickness in the third direction and greater than the first width; and a third transistor on the PMOS region comprising a third gate structure extending From and connected to the second gate structure, and a third plurality of semiconductor sheets spaced apart from the substrate, each of the third plurality of semiconductor sheets has a third width in the first direction greater than a thickness in the third direction and less than or equal to the first width, wherein the first plurality of semiconductor sheets, the second plurality of semiconductor sheets, and the third plurality of semiconductor sheets have a same number of semiconductor sheets positioned substantially at the same level from the substrate, wherein the second width is about 1.4 to about 10 times the third width.

9. The SRAM device of claim 8, wherein the first width is substantially the same as the third width.

10. The SRAM device of claim 8, wherein the first plurality of semiconductor sheets, the second plurality of semiconductor sheets, and the third plurality of semiconductor sheets are stacked in a vertical direction on the substrate.

11. The SRAM device of claim 8, wherein three semiconductor sheets that are respectively selected from the first, second, and third plurality of semiconductor sheets are positioned at the same level and have substantially the same thickness as each other.

12. The SRAM device of claim 11, wherein the first plurality of semiconductor sheets have substantially the same thickness,
the second plurality of semiconductor sheets have substantially the same thickness as each other, and
the third plurality of semiconductor sheets have substantially the same thickness as each other.

13. The SRAM device of claim 8, wherein a length of the second plurality of semiconductor sheets in a second direction, perpendicular to the first direction, is substantially equal to a length of the third plurality of semiconductor sheets in the second direction.

14. The SRAM device of claim 8, further comprising:
a fourth transistor comprising a fourth gate structure extending in the first direction in the PMOS region, fourth source/drain regions in the PMOS region on opposite sides of the fourth gate structure, and a fourth plurality of semiconductor sheets connecting the fourth source/drain regions to each other;
a fifth transistor comprising a fifth gate structure extending in the first direction on the second NMOS region, fifth source/drain regions in the second NMOS region on opposite sides of the fifth gate structure, and a fifth plurality of semiconductor sheets connecting the fifth source/drain regions to each other; and
a sixth transistor comprising a sixth gate structure extending in the first direction on the second NMOS region, sixth source/drain regions in the second NMOS region on opposite sides of the sixth gate structure, and a sixth plurality of semiconductor sheets connecting the sixth source/drain regions to each other,
wherein the sixth plurality of semiconductor sheets have a width in the first direction that is the same as the first width of the first plurality of semiconductor sheets, the fifth plurality of semiconductor sheets have a width in the first direction that is the same as the second width of the second plurality of semiconductor sheets, and the fourth plurality of semiconductor sheets have a width in the first direction that is the same as the third width of the third plurality of semiconductor sheets,
and wherein the fifth transistor and the sixth transistor share an active region that comprises the fifth plurality of semiconductor sheets and the sixth plurality of semiconductor sheets.

15. An SRAM device, comprising:
a substrate comprising an NMOS region and a PMOS region; a first transistor on the NMOS region comprising a first gate structure, a first plurality of semiconductor sheets spaced apart from the substrate in a third direction, each of the first plurality of semiconductor sheets has a first width in a first direction greater than a thickness in the third direction;
a second transistor on the MACS region comprising a second gate structure, a second plurality of semiconductor sheets spaced apart from the substrate, each of the second plurality of semiconductor sheets has a second width in the first direction greater than a thickness in the third direction; and
a third transistor on the PMOS region comprising a third gate structure, a third plurality of semiconductor sheets spaced apart from the substrate, each of the third plurality of semiconductor sheets has a third width in the first direction greater than a thickness in the third direction and less than the second width,
wherein each of the first gate structure, the second gate structure, and the third gate structure comprises a gate, electrode and a gale insulating layer on side and bottom surfaces of the gate electrode,
wherein the first transistor further comprises first barrier insulating patterns between the first plurality of semiconductor sheets and spaced apart from each other in the third direction and the second gate structure comprises second barrier insulating patterns between the second plurality of semiconductor sheets and spaced apart in the third direction,
wherein the first barrier insulating patterns comprise a first lower barrier insulating pattern and a first upper barrier insulating pattern, the second barrier insulating patterns comprise a second lower barrier insulating pattern and a second upper barrier insulating pattern, the first lower barrier insulating pattern and the second lower barrier insulating pattern are at the same level from the substrate, and the first upper barrier insulating pattern and the second upper barrier insulating pattern are at the same level from the substrate,
wherein the first width is less than the second width.

16. The SRAM device of claim 15, wherein a thickness of each of the first barrier insulating patterns in the third direction is less than the first width, wherein a thickness of each of the second barrier insulating patterns in the third direction is less than the second width.

17. The SRAM device of claim 15, wherein three semiconductor sheets, which are respectively selected from the first, second, and third plurality of semiconductor sheets and that are positioned at the same level, have substantially the same thickness.

* * * * *